United States Patent
Hikosaka et al.

(10) Patent No.: US 9,515,146 B2
(45) Date of Patent: Dec. 6, 2016

(54) NITRIDE SEMICONDUCTOR LAYER, NITRIDE SEMICONDUCTOR DEVICE, AND METHOD FOR MANUFACTURING NITRIDE SEMICONDUCTOR LAYER

(71) Applicant: Kabushiki Kaisha Toshiba, Minato-ku (JP)

(72) Inventors: Toshiki Hikosaka, Kawasaki (JP); Hiroshi Ono, Setagaya (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/701,621

(22) Filed: May 1, 2015

(65) Prior Publication Data

US 2015/0380495 A1 Dec. 31, 2015

(30) Foreign Application Priority Data

Jun. 25, 2014 (JP) ................. 2014-130358

(51) Int. Cl.
*H01L 29/04* (2006.01)
*H01L 29/20* (2006.01)
(Continued)

(52) U.S. Cl.
CPC ....... *H01L 29/2003* (2013.01); *H01L 21/0243* (2013.01); *H01L 21/0254* (2013.01); *H01L 21/0262* (2013.01); *H01L 21/02381* (2013.01);
(Continued)

(58) Field of Classification Search
CPC ............ H01L 29/2003; H01L 29/045; H01L 29/7787; H01L 29/151; H01L 21/0254; H01L 21/02381; H01L 21/02609
See application file for complete search history.

(56) References Cited

U.S. PATENT DOCUMENTS 6,153,010 A * 11/2000 Kiyoku ................. B82Y 20/00
117/106
6,562,701 B2 5/2003 Ishida et al.
(Continued)

FOREIGN PATENT DOCUMENTS

JP 2006-298752 11/2006
JP 2007-281140 10/2007
(Continued)

OTHER PUBLICATIONS

Narihito Okada et al. "Characterization and Growth Mechanism of Nonpolar and Semipolar GaN Layers Grown on Patterned Sapphire Substrates", Semiconductor Science and Technology, vol. 27, 2012, 9 pages.
(Continued)

*Primary Examiner* — Christine Enad
(74) *Attorney, Agent, or Firm* — Oblon, McClelland, Maier & Neustadt, L.L.P.

(57) ABSTRACT

According to one embodiment, a nitride semiconductor layer spreading along a first surface is provided. The nitride semiconductor layer includes a first region and a second region. A length of the first region in a first direction parallel to the first surface is longer than a length of the first region in a second direction parallel to the first surface and perpendicular to the first direction. The second region is arranged with the first region in the second direction. A length of the second region in the first direction is longer than a length of the second region in the second direction. A c-axis being is tilted with respect to the second direction for the first region and the second region. The c-axis intersects a third direction perpendicular to the first surface.

20 Claims, 10 Drawing Sheets

(51) Int. Cl.
*H01L 21/02* (2006.01)
*H01L 33/32* (2010.01)
*H01L 29/15* (2006.01)
*H01L 31/0304* (2006.01)
*H01L 31/0352* (2006.01)
*H01L 31/18* (2006.01)
*H01L 29/78* (2006.01)
*H01L 29/872* (2006.01)
*H01L 29/66* (2006.01)
*H01L 33/00* (2010.01)
*H01L 33/16* (2010.01)
*H01L 29/10* (2006.01)
*H01L 29/778* (2006.01)
*H01L 29/737* (2006.01)
*H01L 33/12* (2010.01)

(52) U.S. Cl.
CPC ... *H01L 21/02433* (2013.01); *H01L 21/02458* (2013.01); *H01L 21/02609* (2013.01); *H01L 21/02639* (2013.01); *H01L 29/045* (2013.01); *H01L 29/1075* (2013.01); *H01L 29/151* (2013.01); *H01L 29/66143* (2013.01); *H01L 29/66522* (2013.01); *H01L 29/78* (2013.01); *H01L 29/872* (2013.01); *H01L 31/03044* (2013.01); *H01L 31/035236* (2013.01); *H01L 31/1852* (2013.01); *H01L 31/1856* (2013.01); *H01L 33/007* (2013.01); *H01L 33/16* (2013.01); *H01L 33/32* (2013.01); *H01L 29/66242* (2013.01); *H01L 29/737* (2013.01); *H01L 29/7787* (2013.01); *H01L 33/12* (2013.01)

(56) References Cited

U.S. PATENT DOCUMENTS

| | | | | |
|---|---|---|---|---|
| 2003/0057444 | A1* | 3/2003 | Niki | H01L 33/007 257/200 |
| 2008/0099785 | A1* | 5/2008 | Bai | C30B 25/183 257/190 |
| 2011/0121334 | A1* | 5/2011 | Dai | H01L 33/20 257/98 |
| 2012/0135557 | A1 | 5/2012 | Okuno | |
| 2012/0299014 | A1* | 11/2012 | Hikosaka | H01L 33/12 257/77 |
| 2013/0069107 | A1* | 3/2013 | Nozaki | H01L 33/22 257/103 |
| 2014/0138699 | A1* | 5/2014 | Hikosaka | H01L 21/0254 257/76 |
| 2015/0118777 | A1* | 4/2015 | Seo | H01L 33/20 438/34 |
| 2015/0236200 | A1* | 8/2015 | Hikosaka | H01L 33/20 428/141 |
| 2015/0349203 | A1* | 12/2015 | Shimooka | H01L 33/32 257/13 |

FOREIGN PATENT DOCUMENTS

| | | |
|---|---|---|
| JP | 2008-305977 | 12/2008 |
| JP | 2010-034314 | 2/2010 |
| JP | 2012-114277 | 6/2012 |
| JP | 2013-173641 | 9/2013 |
| JP | 2013-249249 A | 12/2013 |
| KR | 10-2011-0037086 A | 4/2011 |

OTHER PUBLICATIONS

Korean Office Action issued May 4, 2016 in Patent Application No. 10-2015-0065290 (with English translation).

* cited by examiner

NITRIDE SEMICONDUCTOR LAYER, NITRIDE SEMICONDUCTOR DEVICE, AND METHOD FOR MANUFACTURING NITRIDE SEMICONDUCTOR LAYER

CROSS-REFERENCE TO RELATED APPLICATIONS

This application is based upon and claims the benefit of priority from Japanese Patent Application No.2014-130358, filed on Jun. 25, 2014; the entire contents of which are incorporated herein by reference.

FIELD

Embodiments described herein relate generally to a nitride semiconductor layer, a nitride semiconductor device, and a method for manufacturing the nitride semiconductor layer.

BACKGROUND

Semiconductor light emitting devices (e.g., light emitting diodes) that use nitride semiconductors are used in display devices, illumination, etc. Also, nitride semiconductors are utilized in high-speed electronic devices and power devices. When a nitride semiconductor layer is formed on a substrate having a different lattice constant or coefficient of thermal expansion, cracks and warp of the substrate occur easily. Technology is desirable for improving the performance, reducing the warp, suppressing the cracks, and realizing high productivity.

DETAILED DESCRIPTION

Figure 1A:
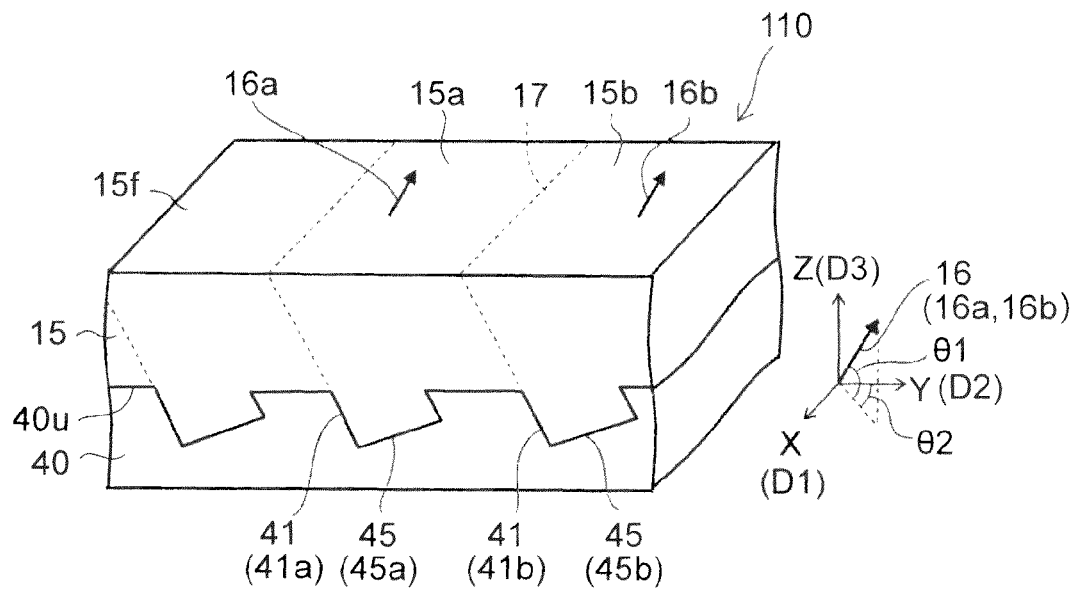
FIG. 1A and FIG. 1B are schematic perspective views showing a nitride semiconductor device according to a first embodiment.

According to one embodiment, a nitride semiconductor layer spreading along a first surface is provided. The nitride semiconductor layer includes a first region and a second region. A length of the first region in a first direction parallel to the first surface is longer than a length of the first region in a second direction parallel to the first surface and perpendicular to the first direction. The second region is arranged with the first region in the second direction. A length of the second region in the first direction is longer than a length of the second region in the second direction. A c-axis being is tilted with respect to the second direction for the first region and the second region. The c-axis intersects a third direction perpendicular to the first surface.

According to one embodiment, a nitride semiconductor device includes a substrate and a nitride semiconductor layer. The substrate includes a major surface having an upper surface and a plurality of oblique surfaces. The oblique surfaces are tilted with respect to the upper surface. Each length of the oblique surfaces in a first direction parallel to the upper surface is longer than each length of the oblique surfaces in a second direction parallel to the upper surface and perpendicular to the first direction. The oblique surfaces are arranged in the second direction. The nitride semiconductor layer is grown from the oblique surfaces. A c-axis of the nitride semiconductor layer is tilted with respect to the second direction. The c-axis intersects a third direction perpendicular to the upper surface.

According to one embodiment, a nitride semiconductor device includes a nitride semiconductor layer. The nitride semiconductor layer is grown from a plurality of oblique surfaces of a substrate. The substrate includes a major surface having an upper surface and the oblique surfaces. The oblique surfaces are tilted with respect to the upper surface. Each length of the oblique surfaces in a first direction parallel to the upper surface is longer than each length of the oblique surfaces in a second direction parallel to the upper surface and perpendicular to the first direction. The oblique surfaces are arranged in the second direction. A c-axis of the nitride semiconductor layer is tilted with respect to the second direction. The c-axis intersects a third direction perpendicular to the upper surface.

According to one embodiment, a method for manufacturing a nitride semiconductor layer is disclosed. The method includes preparing a substrate. The substrate includes a major surface having an upper surface and a plurality of oblique surfaces. The oblique surfaces are tilted with respect to the upper surface. Each length of the oblique surfaces in a first direction parallel to the upper surface is longer than each length of the oblique surfaces in a second direction parallel to the upper surface and perpendicular to the first direction. The oblique surfaces are arranged in the second direction. The method includes growing the nitride semiconductor layer from the oblique surfaces. A c-axis of the nitride semiconductor layer is tilted with respect to the second direction. The c-axis intersects a third direction perpendicular to the upper surface.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

The embodiment relates to a nitride semiconductor device. The nitride semiconductor device according to the embodiment includes a semiconductor light emitting device, a semiconductor light receiving device, an electronic device, etc. The semiconductor light emitting device includes, for example, a light emitting diode (LED), a laser diode (LD), etc. The semiconductor light receiving device includes a photodiode (PD), etc. The electronic device includes, for example, a high electron mobility transistor (HEMT), a heterojunction bipolar transistor (HBT), a field effect transistor (FET), a Schottky barrier diode (SBD), etc.

Figure 1B:
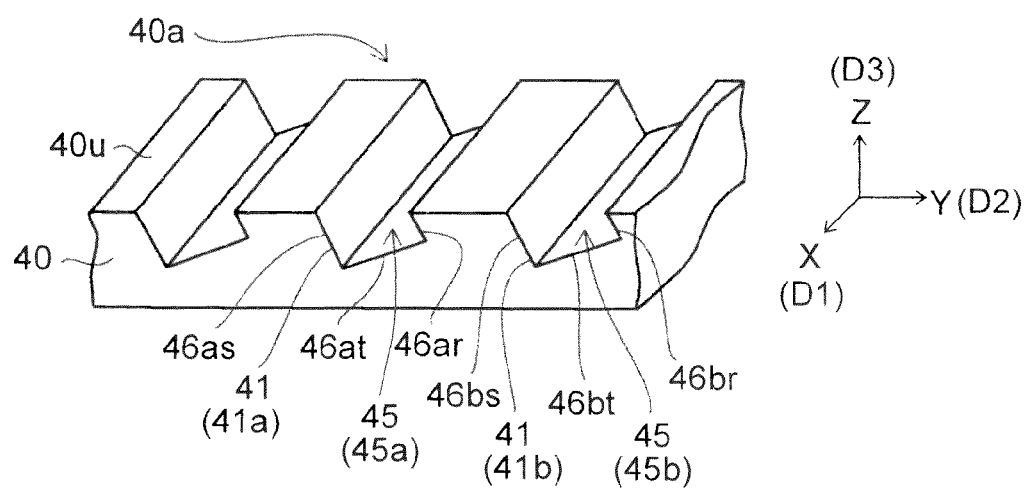

FIG. 1A and FIG. 1B are schematic perspective views illustrating the nitride semiconductor device according to the first embodiment.

As shown in FIG. 1A, the nitride semiconductor device 110 according to the embodiment includes a substrate 40 and a nitride semiconductor layer 15.

The nitride semiconductor layer 15 spreads along a first surface 15f (e.g., an X-Y plane). The first surface 15f is a plane. A macroscopic major surface of the nitride semiconductor layer 15 corresponds to the first surface 15f. The major surface of the nitride semiconductor layer 15 is parallel to the X-Y plane. The nitride semiconductor layer 15 includes a first region 15a and a second region 15b.

One direction parallel to the X-Y plane is taken as an X-axis direction. A direction parallel to the X-Y plane and perpendicular to the X-axis direction is taken as a Y-axis direction. A direction perpendicular to the X-Y plane is taken as a Z-axis direction. The X-axis direction is taken as a first direction D1. The Y-axis direction is taken as a second direction D2. The Z-axis direction is taken as a third direction D3.

The first region 15a and the second region 15b extend along the first direction D1. The first direction D1 is parallel to the first surface 15f. The second region 15b is arranged with the first region 15a in the first surface 15f. The second region 15b is arranged with the first region 15a in the second direction D2. The second region 15b contacts the first region 15a.

The length of the first region 15a in the first direction D1 is longer than the length of the first region 15a in the second direction D2. The length of the second region 15b in the first direction D1 is longer than the length of the second region 15b in the second direction D2.

For example, the length of the first region 15a in the first direction D1 is longer than the length of the first region 15a in the third direction D3. For example, the length of the second region 15b in the first direction D1 is longer than the length of the second region 15b in the third direction D3.

For example, a boundary 17 between the first region 15a and the second region 15b may be observed by observing the cross section using a TEM (transmission electron microscope). Also, the boundary 17 may be observed by observing the front surface (the first surface 15f) using an atomic force microscope (AFM) or cathode luminescence (CL).

The nitride semiconductor layer 15 has a c-axis 16. The first region 15a has a c-axis 16a. The second region 15b has a c-axis 16b. The c-axis 16a is substantially parallel to the c-axis 16b. For example, the direction of the c-axis 16 (the c-axis 16a and the c-axis 16b) can be observed by X-ray diffraction. The c-axis 16a of the first region 15a and the c-axis of the second region 15b are parallel to each other. The direction of bright and dark regions observed in a TEM image, etc., of the first region 15a is parallel to the direction of bright and dark regions observed in a TEM image, etc., of the second region 15b. For example, the direction of the macroscopic c-axis 16 of the nitride semiconductor layer 15 is observed by X-ray diffraction. In such a case, the macroscopic direction may be considered to match the direction of the c-axis 16a and the direction of the c-axis 16b.

The c-axis 16 (the c-axis 16a and the c-axis 16b) of the nitride semiconductor layer 15 is tilted with respect to the first direction D1. The c-axis 16 (the c-axis 16a and the c-axis 16b) is neither parallel nor perpendicular to the first direction D1.

The c-axis 16 (the c-axis 16a and the c-axis 16b) of the nitride semiconductor layer 15 is tilted with respect to the second direction D2. The c-axis 16 (the c-axis 16a and the c-axis 16b) is neither parallel nor perpendicular to the second direction D2.

The direction (the axis) of the c-axis 16 (the c-axis 16a and the c-axis 16b) of the nitride semiconductor layer 15 projected onto the first surface 15f is tilted with respect to the second direction D2. An angle θ2 between the second direction D2 and the direction of the c-axis 16a of the first region 15a projected onto the first surface 15f is, for example, not less than 5 degrees and not more than 85 degrees. The angle θ2 between the second direction D2 and the direction of the c-axis 16b of the second region 15b projected onto the first surface 15f is, for example, not less than 5 degrees and not more than 85 degrees.

Thus, the directions (the axes) of the c-axis 16a of the first region 15a and the c-axis 16b of the second region 15b projected onto the first surface 15f are tilted with respect to the extension direction (the first direction D1) of the boundary 17 between the first region 15a and the second region 15b. The directions (the axes) of the c-axis 16a of the first region 15a and the c-axis 16b of the second region 15b projected onto the first surface 15f are tilted with respect to the second direction D2 that is perpendicular to the extension direction (the first direction D1) of the boundary 17.

The c-axis 16 (the c-axis 16a and the c-axis 16b) of the nitride semiconductor layer 15 intersects the third direction D3 (the direction (the axis) perpendicular to the first surface 15f). The c-axis 16 of the nitride semiconductor layer 15 is substantially perpendicular to the third direction D3 or tilted with respect to the third direction D3.

In the example, the c-axis 16 (the c-axis 16a and the c-axis 16b) of the nitride semiconductor layer 15 is tilted with respect to the first surface 15f. An angle θ1 between the first surface 15f and the c-axis 16a of the first region 15a is not less than 0 degrees and not more than 85 degrees. The angle θ1 between the first surface 15f and the c-axis 16b of the second region 15b is, for example, not less than 0 degrees and not more than 85 degrees. For example, the major surface 15f is different from the c-plane. The major surface 15f is different from a crystal plane provided at an off angle from the c-plane (a misoriented substrate or a miscut substrate). For example, the major surface 15*f* is a semi-polar plane. Or, for example, the major surface 15*f* is a non-polar plane.

Such a nitride semiconductor layer 15 is obtained by crystal growth using the substrate 40 having the oblique surfaces.

FIG. 1B is a schematic perspective view illustrating the substrate 40.

The substrate 40 has a major surface 40*a*. The major surface 40*a* is a macroscopic major surface of the substrate 40. The major surface 40*a* is substantially parallel to the first surface 15*f*. The substrate 40 spreads along the major surface 40*a*.

The major surface 40*a* includes an upper surface 40*u* (a top surface) and multiple oblique surfaces 41. Each of the multiple oblique surfaces 41 is tilted with respect to the upper surface 40*u*. The macroscopic major surface 40*a* is considered to be parallel to the upper surface 40*u*. The multiple oblique surfaces 41 are tilted with respect to the first surface 15*f*. The multiple oblique surfaces 41 are arranged in the second direction D2.

The oblique surface 41 includes, for example, an oblique surface 41*a* and an oblique surface 41*b*. The oblique surface 41*b* is separated from the oblique surface 41*a* in the second direction D2.

The length along the first direction D1 of each of the multiple oblique surfaces 41 (e.g., the oblique surface 41*a* and the oblique surface 41*b*) is longer than the length along the second direction D2 of each of the multiple oblique surfaces 41 (the oblique surface 41*a* and the oblique surface 41*b*). The length along the first direction D1 of each of the multiple oblique surfaces 41 (e.g., the oblique surface 41*a* and the oblique surface 41*b*) is longer than the length along the third direction D3 of each of the multiple oblique surfaces 41 (the oblique surfaces 41*a* and 41*b*).

The nitride semiconductor layer 15 is grown from the multiple oblique surfaces 41. The c-axis 16 of the nitride semiconductor layer 15 is tilted with respect to the upper surface 40*u* (the major surface 40*a*) of the substrate 40. The c-axis 16 intersects the third direction D3 (the direction perpendicular to the upper surface 40*u*).

In the example, the substrate 40 has multiple recesses 45. The multiple recesses 45 are arranged in the second direction D2. The multiple oblique surfaces 41 respectively are portions of side surfaces of the multiple recesses 45.

For example, the multiple recesses 45 include a first recess 45*a* and a second recess 45*b*. The first recess 45*a* and the second recess 45*b* extend along the first direction D1. The length in the first direction D1 of each of the multiple recesses 45 (the first recess 45*a*, the second recess 45*b*, etc.) is longer than the length in the second direction D2 of each of the multiple recesses 45. The length in the first direction D1 of each of the multiple recesses 45 (the first recess 45*a*, the second recess 45*b*, etc.) is longer than the length in the third direction D3 of each of the multiple recesses 45.

The first recess 45*a* has a side surface 46*as*, a side surface 46*ar*, and a bottom surface 46*at*. The side surface 46*ar* opposes the side surface 46*as*. The bottom surface 46*at* is connected to the side surface 46*as* and the side surface 46*ar*.

The second recess 45*b* has a side surface 46*bs*, a side surface 46*br*, and a bottom surface 46*bt*. The side surface 46*br* opposes the side surface 46*bs*. The bottom surface 46*bt* is connected to the side surface 46*bs* and the side surface 46*br*.

The side surface 46*as*, the side surface 46*ar*, the side surface 46*bs*, and the side surface 46*br* are parallel to the first direction D1.

The side surface 46*ar* is disposed between the side surface 46*as* and the side surface 46*bs*. The side surface 46*bs* is disposed between the side surface 46*ar* and the side surface 46*br*. The side surface 46*as* and the side surface 46*ar* face each other. The side surface 46*bs* and the side surface 46*br* face each other.

In the example, the side surface 46*ar* is substantially parallel to the side surface 46*as*. The side surface 46*br* is substantially parallel to the side surface 46*bs*.

Thus, in the substrate 40, each of the multiple recesses 45 includes a first side surface and a second side surface that face each other. The first side surfaces are, for example, the side surface 46*as* and the side surface 46*bs*. The second side surfaces are, for example, the side surface 46*ar* and the side surface 46*br*.

The multiple oblique surfaces 41 are the first side surfaces (the side surface 46*as* and the side surface 46*bs*) of the multiple recesses 45.

In the example, the second side surfaces (the side surface 46*ar*, the side surface 46*br*, etc.) are parallel to the first side surfaces (the side surface 46*as* and the side surface 46*bs*).

In the embodiment, as described below, the extension direction (the first direction D1) of the recess 45 is set to be tilted at a prescribed angle from the crystal orientation of the substrate 40. In other words, the extension direction (the first direction D1) of the oblique surfaces 41 (e.g., the side surface 46*as* and the side surface 46*bs*) is set to be tilted at a prescribed angle from the crystal orientation of the substrate 40. The c-axis 16 of the nitride semiconductor layer 15 is tilted with respect to the second direction D2 by performing crystal growth from such oblique surfaces 41.

The oblique surfaces 41 also are tilted with respect to the third direction D3. The c-axis 16 of the nitride semiconductor layer 15 that is grown from the oblique surfaces 41 intersects the third direction D3. The c-axis 16 is tilted with respect to the third direction D3.

The nitride semiconductor layer 15 according to the embodiment is obtained by performing crystal growth from such oblique surfaces 41 (e.g., the side surface 46*as* and the side surface 46*bs*) of the substrate 40.

The substrate 40 includes, for example, one of silicon, sapphire, spinel, GaAs, InP, ZnO, Ge, SiGe, or SiC. For example, the lattice constant of the substrate 40 is different from the lattice constant of the nitride semiconductor layer 15. The coefficient of thermal expansion of the substrate 40 is different from the coefficient of thermal expansion of the nitride semiconductor layer 15.

In the case where the substrate 40 has at least one of a lattice constant or a coefficient of thermal expansion that is different from that of the nitride semiconductor layer 15, the warp of the substrate 40 easily becomes large. Cracks occur easily when the warp of the substrate 40 becomes too large.

On the other hand, in the case where a heterostructure is formed for a nitride semiconductor layer having the c-plane as a major surface, a large polarization electric field is generated; and the performance of the device is affected. In the case where the major surface is a plane (a semi-polar plane or a non-polar plane) different from the c-plane, for example, the internal electric field that is generated in the functional layer is suppressed; and the performance of the device is improved. However, it was found that warp and cracks of the substrate occur particularly easily in the case where a crystal having a semi-polar plane or a non-polar plane is formed on a substrate having a different lattice constant or coefficient of thermal expansion.

According to investigations of the inventor of the application, it was found that the occurrence of such warp and cracks is dependent on the anisotropy in the X-Y plane of the characteristics of the nitride semiconductor layer. For example, in the nitride semiconductor layer, the coefficient of thermal expansion in the a-axis direction is different from the coefficient of thermal expansion in the c-axis direction. When a crystal having a semi-polar plane or a non-polar plane is used in such a case, a component of the a-axis and a component of the c-axis exist in the X-Y plane. Therefore, the coefficients of thermal expansion in the two directions in the X-Y plane are different from each other. In other words, the coefficient of thermal expansion has anisotropy in the plane. Therefore, anisotropy of the warp occurs easily as well. The warp in one direction becomes large. Therefore, cracks occur particularly easily.

In the embodiment, the c-axis 16 of the nitride semiconductor layer 15 intersects the third direction D3. In other words, a nitride semiconductor having a semi-polar plane or a non-polar plane is used as the nitride semiconductor layer. Thereby, the internal electric field is suppressed. For example, the internal electric field that is generated in the functional layer is suppressed. In such a case, the c-axis 16 of the nitride semiconductor layer 15 is tilted with respect to the first direction D1. Thereby, for example, the in-plane anisotropy of the coefficient of thermal expansion is suppressed. Thereby, the warp is suppressed; and the cracks are suppressed. A high production yield is obtained while improving the characteristics of the device.

The nitride semiconductor layer 15 is formed by the union of the crystals grown from the multiple oblique surfaces 41. The multiple crystals are the multiple regions (e.g., the first region 15a, the second region 15b, etc.). The crystals unite at the boundary 17 between the multiple regions. Stress is generated at the boundary 17 where the crystals unite. For example, tensile stress is generated in a direction intersecting the boundary 17. In the case where the anisotropy of the coefficient of thermal expansion is large at the boundary 17, a large stress is applied in one direction at the boundary 17. As a result, warp and cracks occur easily.

In the nitride semiconductor layer 15 according to the embodiment, the c-axis 16 is set to be tilted with respect to the extension direction (the first direction D1) of the boundary 17 between the two regions (e.g., the first region 15a and the second region 15b). In other words, the c-axis 16 is set to be tilted with respect to the second direction D2. Thereby, the anisotropy of the coefficient of thermal expansion occurring at the boundary 17 can be small. According to the embodiment, the stress is relaxed; the warp can be suppressed; and the cracks can be suppressed.

According to the embodiment, a nitride semiconductor layer and a nitride semiconductor device having high productivity are obtained.

The anisotropy of the coefficient of thermal expansion is described below.

Figure 2:
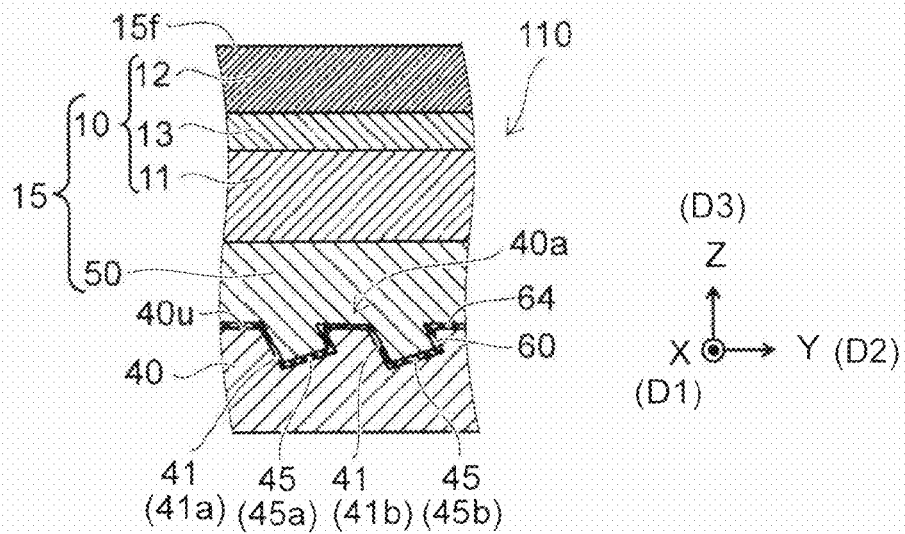
FIG. 2 is a schematic cross-sectional view showing the nitride semiconductor device according to the first embodiment.

FIG. 2 is a schematic cross-sectional view illustrating the nitride semiconductor device according to the first embodiment.

In the example shown in FIG. 2, the nitride semiconductor layer 15 includes, for example, a foundation layer 50 and a functional layer 10. In the example, the nitride semiconductor layer 15 further includes a buffer layer 60.

The substrate 40 is, for example, a (113) plane silicon substrate.

The substrate 40 has the multiple recesses 45. The multiple oblique surfaces 41 are provided respectively in the multiple recesses 45.

The buffer layer 60 is provided on a portion (the multiple oblique surfaces 41) of the substrate 40. The foundation layer 50 is provided on the buffer layer 60. The functional layer 10 is provided on the foundation layer 50. The buffer layer 60, the foundation layer 50, and the functional layer 10 are sequentially formed in this order on the substrate 40. Epitaxial growth is performed to form these layers. The buffer layer 60, the foundation layer 50, and the functional layer 10 are nitride semiconductors.

A mask layer 64 may be provided on the upper surface 40u of the substrate 40 except for the recesses 45. The mask layer 64 includes, for example, a silicon oxide film ($SiO_2$) and/or a silicon nitride film ($SiN_x$). There are cases where the buffer layer 60 is not provided on at least a portion of the mask layer 64. The foundation layer 50 is provided on the buffer layer 60 and on the mask layer 64.

The buffer layer 60 includes, for example, an AlN layer. The thickness of the AlN layer is, for example, about 100 nanometers (nm). The AlN layer contacts the substrate 40.

The buffer layer 60 may include GaN. In the case where GaN is used as the buffer layer 60, the thickness of the GaN layer is, for example, about 30 nm. The buffer layer 60 may include a mixed crystal of nitride semiconductors (e.g., AlGaN, InGaN, etc.).

Chemical reactions do not occur easily between AlN and silicon. In the case where the substrate 40 includes a silicon substrate, AlN is used as the buffer layer 60 contacting the silicon substrate. Thereby, for example, meltback etching that occurs due to reactions between silicon and gallium, etc., is suppressed.

In the buffer layer 60, it is favorable for the AlN layer to be monocrystalline. The monocrystalline AlN layer can be formed by epitaxial growth of AlN at a high temperature of 1000° C. or more.

The difference between the coefficients of thermal expansion of silicon and a nitride semiconductor is large. In the case where a silicon substrate is used as the substrate 40, the coefficient of thermal expansion difference between the substrate 40 and the nitride semiconductor is larger than that of other materials. Therefore, the warp of the substrate 40 occurring after the epitaxial growth is large; and cracks occur particularly easily.

For example, stress can be formed inside the nitride semiconductor in the epitaxial growth by using a buffer layer 60 of monocrystalline AlN. Thereby, the warp of the substrate 40 after the growth ends can be suppressed.

It is favorable for tensile stress (strain) to be formed in the buffer layer 60 (the AlN layer). Defect formation at the interface between the substrate 40 and the buffer layer 60 is suppressed by the tensile stress (strain) formed in the AlN layer.

The foundation layer 50 includes, for example, a GaN layer. The foundation layer 50 may include indium (In). The lattice mismatch between the foundation layer 50 and the substrate 40 (e.g., the silicon substrate) is relaxed by the foundation layer 50 including In; and the occurrence of dislocations is suppressed. In the case where the foundation layer 50 includes In, desorption reactions of the In occur easily in the crystal growth. It is favorable for the In composition ratio to be not more than 0.5. Thereby, a foundation layer 50 having good flatness can be obtained.

The foundation layer 50 is selectively grown from the side surfaces (the oblique surfaces 41) of the multiple recesses 45 of the substrate 40. The multiple crystals (the GaN crystals) that are grown from the side surfaces of adjacent recesses 45 meet each other. The multiple crystals unite. As the growth continues, the upper surface (the first surface 15f) of the GaN crystal becomes flat and parallel to the upper surface 40u (the major surface 40a) of the substrate 40.

For example, in the case where a (113) plane silicon substrate is used as the substrate 40, the (11-22) plane of the nitride semiconductor layer 15 is parallel to the first surface 15f. In other words, the (11-22) plane is parallel to the upper surface 40u (the major surface 40a) of the substrate 40. In such a case, the angle between the c-axis 16 of the nitride semiconductor layer 15 and the axis (the Z-axis) perpendicular to the first surface 15f is about 58 degrees. In other words, the angle θ1 between the first surface 15f and the c-axis 16 of the nitride semiconductor layer 15 is about 32 degrees.

Thus, the substrate 40 in which the unevenness (the multiple recesses 45) is formed is used; and the nitride semiconductor crystal is grown selectively on the side surfaces of the recesses 45. Thereby, the c-axis 16 of the nitride semiconductor layer 15 (e.g., the foundation layer 50) is tilted with respect to the upper surface 40u (the major surface 40a) of the substrate 40.

The c-axis of the functional layer 10 is substantially parallel to the c-axis of the foundation layer 50. Accordingly, the c-axis 16 of the functional layer 10 is tilted with respect to the second direction D2. The c-axis 16 of the functional layer 10 is tilted with respect to the third direction D3 (the direction perpendicular to the upper surface 40u).

In the example, the nitride semiconductor device 110 is a light emitting device. The functional layer 10 includes, for example, a first semiconductor layer 11, an active layer 13 (e.g., a light emitting layer), and a second semiconductor layer 12. The first semiconductor layer 11 is disposed between the second semiconductor layer 12 and the substrate 40. The second semiconductor layer 12 is separated from the first semiconductor layer 11 in the third direction D3. The active layer 13 is disposed between the second semiconductor layer 12 and the first semiconductor layer 11. The first semiconductor layer is a first conductivity type. The second semiconductor layer is a second conductivity type. The first conductivity type is, for example, an n-type; and the second conductivity type is, for example, a p-type.

The active layer 13 includes multiple barrier layers, and a well layer provided between the multiple barrier layers. The barrier layer includes, for example, GaN. The well layer includes, for example, InGaN (e.g., $In_{0.15}Ga_{0.85}N$). The active layer 13 has a MQW (Multi-Quantum Well) structure or a SQW (Single-Quantum Well) structure. The thickness of the functional layer 10 is, for example, not less than 1 micrometer (μm) and not more than 5 μm, e.g., about 3.5 μm. The thickness of the functional layer 10 may be, for example, about 2 μm.

In the example, the first semiconductor layer 11, the active layer 13, and the second semiconductor layer 12 are stacked in this order on the substrate 40.

In the specification, the state of being stacked includes the state of overlapping in contact with each other and the state of overlapping with another layer inserted therebetween. The state of being provided on a component includes the state of being provided in direct contact and the state of being provided with another layer inserted therebetween.

As described below, there are cases where the nitride semiconductor device 110 is used in the state in which the substrate 40, the buffer layer 60, and the foundation layer 50 are removed.

For example, the impurity concentration of at least a portion of the functional layer 10 (e.g., at least one of the first semiconductor layer 11 or the second semiconductor layer 12) is higher than the impurity concentration of the foundation layer 50.

Figure 3A:
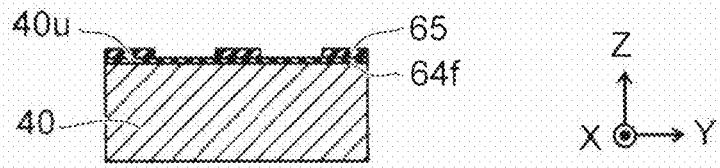
FIG. 3A to FIG. 3C are schematic cross-sectional views in order of the processes, showing a method for manufacturing the nitride semiconductor device according to the first embodiment.
Figure 3B:
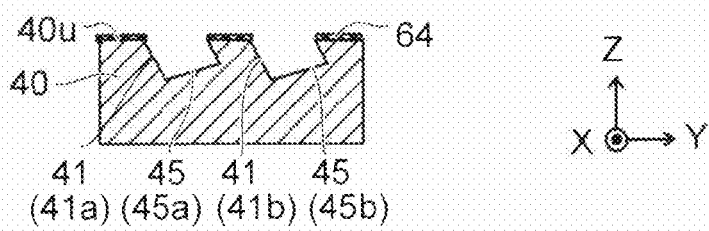
Figure 3C:
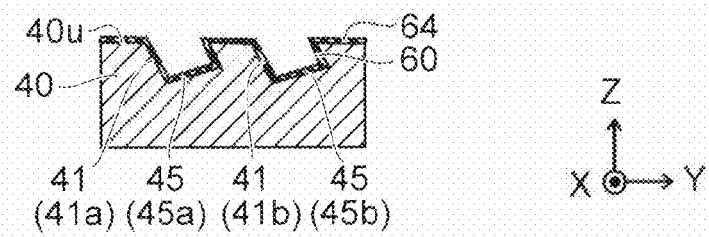

FIG. 3A to FIG. 3C are schematic cross-sectional views in order of the processes, illustrating a method for manufacturing the nitride semiconductor device according to the first embodiment.

The substrate 40 is prepared as shown in FIG. 3A. The substrate 40 includes, for example, a (113) plane silicon substrate. The orientation of the orientation flat of the silicon substrate is, for example, the <-110> direction. A silicon oxide film 64f that is used to form the mask layer 64 is formed on the silicon substrate. The silicon oxide film 64f is, for example, a thermal oxide film. The thickness of the silicon oxide film 64f is, for example, about 100 nanometers (nm). A resist film 65 having a prescribed configuration is formed on the silicon oxide film 64f. The configuration of the resist film 65 is, for example, a stripe configuration. The extension direction of the stripes is set to be tilted at a prescribed angle from the crystal orientation of the substrate 40. The extension direction of the stripes is tilted at a prescribed angle from the <21-1> direction of the silicon toward the <110> direction. The angle of the tilt is not less than 5 degrees and not more than 85 degrees.

The width (the length in a direction orthogonal to the extension direction of the stripes) of the resist film 65 is, for example, about 3 μm. The width of the opening (the spacing between multiple stripes) of the resist film 65 is, for example, about 7 μm. The period of the stripes is, for example, about 10 μm.

The silicon oxide film 64f at the openings is removed using the resist film 65 as a mask. The removal includes, for example, etching using buffered hydrofluoric acid. $O_2$ asher processing may be performed prior to the removal. The hydrophilic properties improve; and the uniformity of the etching improves. After removing a portion of the silicon oxide film 64f, the resist film 65 is removed. Thereby, the mask layer 64 is formed.

As shown in FIG. 3B, the substrate 40 is patterned using the mask layer 64 as a mask. Namely, the recesses 45 having the multiple stripe configurations are made in the substrate 40. The patterning includes, for example, processing using a potassium hydroxide (KOH) solution (25 wt % at 45° C.) for, for example, 15 minutes. Due to the anisotropy of the etching rate of the silicon, the side surfaces of the recesses 45 are tilted with respect to the Z-axis. In other words, the oblique surfaces 41 are formed. In the case where the silicon is etched by the KOH solution, the etching rate of the (111) plane of the silicon is slower than that of the other crystal planes; and the (111) plane of the silicon is formed easily as the oblique surfaces 41. In the patterning, the oblique surfaces 41 may be formed using dry etching.

Thereby, the substrate 40 that has the multiple recesses 45 having tilted side surfaces is obtained. Some of the side surfaces (side walls) of the recesses 45 are (1-11) plane of the silicon. The side surfaces (the oblique surfaces 41) are tilted with respect to the (113) plane of the upper surface 40u of the substrate 40. The angle between the (113) plane and the side surfaces (the oblique surfaces 41) is about 58.5 degrees. The nitride crystal grows from the oblique surfaces 41 (i.e., the (1-11) plane). Some of the side surfaces (side walls) are not limited to the (1-11) plane; and it is sufficient for the side surface to be a crystal plane equivalent to the (111) plane (a crystal plane expressed as the {111} plane as an inclusive expression using Miller indexes) such as the (11-1) plane, the (-11-1) plane, etc. The crystal growth of the nitride crystal is possible by forming a crystal plane equivalent to the (111) plane of silicon.

As shown in FIG. 3C, the buffer layer 60 is formed on the oblique surfaces 41 of the substrate 40. The foundation layer 50 is formed on the buffer layer 60; and epitaxial growth of the functional layer 10 on the foundation layer 50 is performed. An example of the epitaxial growth is described below.

For example, the substrate 40 recited above in which the oblique surfaces 41 are formed is processed by organic cleaning and acid cleaning. Subsequently, the substrate 40 is introduced to the reactor of a MOCVD apparatus. An AlN layer that is used to form the buffer layer 60 is formed using tri-methyl aluminum (TMAI) and ammonia ($NH_3$). The thickness of the buffer layer 60 is about 100 nm.

Subsequently, an undoped GaN layer that is used to form a portion of the foundation layer 50 is grown using TMGa and ammonia in an atmosphere including nitrogen and hydrogen. At this time, the growth temperature is about 1060° C.; the growth pressure is 600 hPa; and the V/III ratio is 3300. The undoped GaN layer grows from the (1-11) plane (i.e., the oblique surfaces 41) which is the side surfaces (the side walls) of the recesses 45.

Thereby, a GaN crystal having the c-axis 16 tilted 58.5 degrees from a direction perpendicular to the upper surface 40u (the major surface 40a) of the substrate 40 is obtained. In other words, the angle θ1 between the upper surface 40u and the c-axis 16 of the GaN layer is 31.5 degrees.

In the initial growth of the undoped GaN layer, the undoped GaN layer is a crystal having a stripe configuration. The mutually-adjacent crystals having the stripe configuration meet as the growth time increases. Thereby, the major surface (the front surface) of the undoped GaN layer becomes the (11-22) plane.

The foundation layer 50 is formed by continuing the crystal growth. The functional layer 10 is formed by forming the first semiconductor layer 11, the active layer 13, and the second semiconductor layer 12 on the foundation layer 50. Thereby, the nitride semiconductor device 110 is obtained.

Examples of experimental results relating to the nitride semiconductor layer 15 will now be described.

In the experiment, the extension direction (the first direction D1) of the recesses 45 made in the substrate 40 is modified. In other words, the extension direction of the stripes of the resist film 65 is modified. The angle between the extension direction of the stripes of the resist film 65 and the <21-1> direction of the silicon is modified. In a first sample, the extension direction of the stripes of the resist film 65 is parallel to the <21-1> direction of the silicon (the tilt angle is 0 degrees). In a second sample, the extension direction of the stripes of the resist film 65 is tilted 13 degrees toward the <110> direction from the <21-1> direction of the silicon (the tilt angle is 13 degrees). In a third sample, the extension direction of the stripes of the resist film 65 is tilted 18 degrees toward the <110> direction from the <21-1> direction of the silicon (the tilt angle is 18 degrees).

In the first to third samples, the width of the resist film 65 is about 3 μm. The width of the opening of the resist film 65 is about 7 μm. The period of the stripes is about 10 μm.

An AlN layer is formed on the three types of substrates 40 as the buffer layer 60; and the foundation layer 50 of GaN is formed. At this time, the state of the growth of the GaN layer is observed by changing the growth time of the GaN layer. The thickness of the GaN layer is about 2 μm for a growth time of 90 minutes.

Figure 4A:
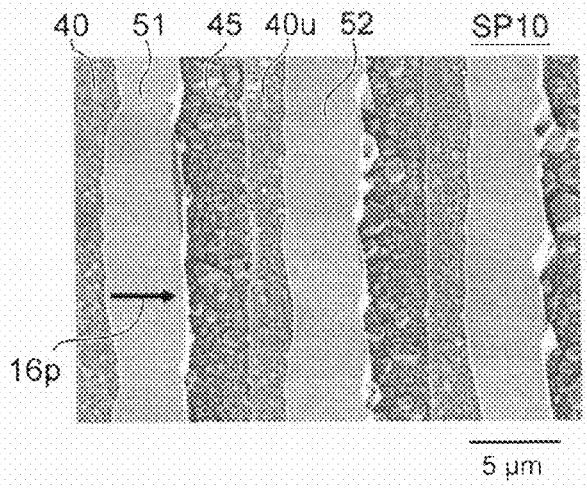
FIG. 4A to FIG. 4C are electron microscope photographs showing experimental results relating to the nitride semiconductor device.
Figure 4A:
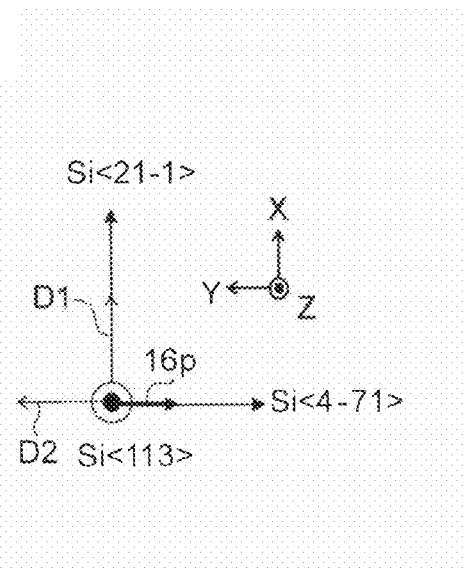
Figure 4B:
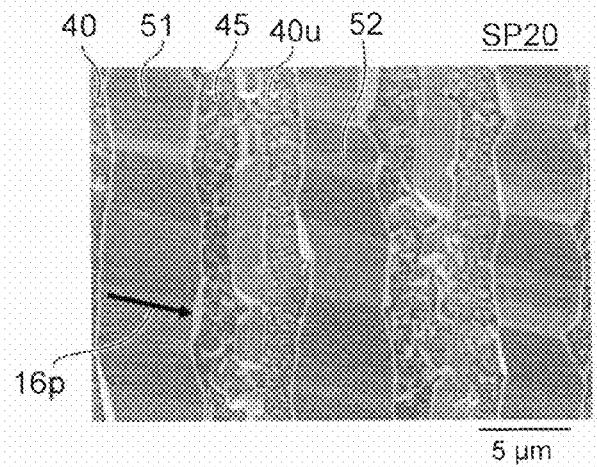
Figure 4B:
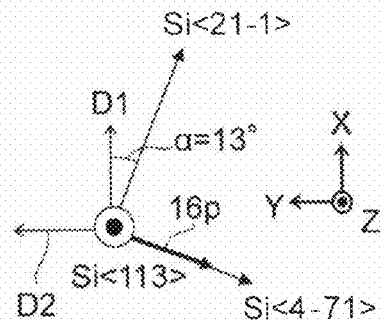
Figure 4C:
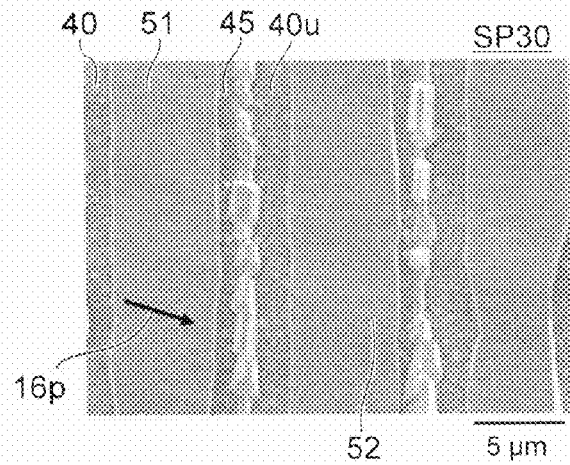
Figure 4C:
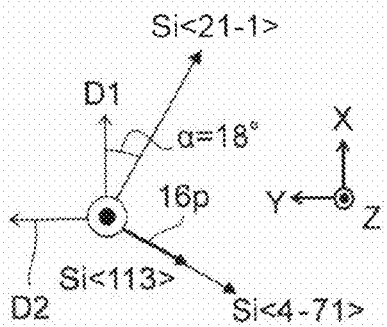

FIG. 4A to FIG. 4C are electron microscope photographs illustrating the experimental results of the nitride semiconductor device.

FIG. 4A to FIG. 4C correspond to the first sample SP10, the second sample SP20, and the third sample SP30 recited above. The electron micrographs are SEM images observing from a direction (the third direction D3) perpendicular to the upper surface 40u (the major surface 40a) of the substrate 40. In these examples, the growth time of the GaN layer is 30 minutes; and these examples are at a stage partway through the growth of the GaN layer. In other words, this state is prior to the union of the multiple crystals growing from the multiple side surfaces of the recesses 45.

As shown in FIG. 4A, the recesses 45 of the substrate 40, the upper surface 40u (the mask layer 64), and the initial growth of the GaN layer 51 that is used to form a portion of the foundation layer 50 are observed. The GaN layer 51 has a stripe configuration aligned with the recesses 45.

In the first sample SP10, the extension direction (the first direction D1) of the recesses 45 is aligned with the <21-1> direction. In such a case, a direction 16p of the c-axis of the GaN layer 51 projected onto the X-Y plane (the first surface 15f, i.e., the upper surface 40u of the substrate 40) is aligned with a direction (the second direction D2) perpendicular to the extension direction (the first direction D1) of the recesses 45. In the first sample SP10, the c-axis of the GaN layer 51 is perpendicular to the extension direction of the recesses 45. Ridgelines 52 (stepped portions) are observed at the front surface of the GaN layer 51. The ridgelines 52 are aligned with a direction (the second direction D2) perpendicular to the extension direction (the first direction D1) of the recesses 45. The ridgelines 52 originate in the unevenness of the crystal surface. The extension direction of the ridgelines 52 is aligned with the direction 16p.

In the second sample SP20 (the tilt angle being 13 degrees) as shown in FIG. 4B, the direction 16p of the c-axis of the GaN layer 51 projected onto the X-Y plane is tilted with respect to a direction (the second direction D2) perpendicular to the extension direction (the first direction D1) of the recesses 45. The angle between the direction 16p and the second direction D2 is the same as the tilt angle and is 13 degrees. The angle between the second direction D2 and the extension direction of the ridgelines 52 is 13 degrees.

Also, in the third sample SP30 (the tilt angle being 18 degrees) as shown in FIG. 4C, the direction 16p of the c-axis of the GaN layer 51 projected onto the X-Y plane is tilted with respect to a direction (the second direction D2) perpendicular to the extension direction (the first direction D1) of the recesses 45. The angle between the direction 16p and the second direction D2 is the same as the tilt angle and is 18 degrees. The angle between the second direction D2 and the extension direction of the ridgelines 52 is 18 degrees.

Similarly to the examples shown in FIG. 4B and FIG. 4C, for example, the angle between the second direction D2 and the extension direction of the ridgelines 52 can be known from, for example, a SEM image observing from a direction (the third direction D3) perpendicular to the major surface 15f. From this angle, it can be determined whether or not the direction 16p is tilted with respect to the second direction D2.

Figure 5A:
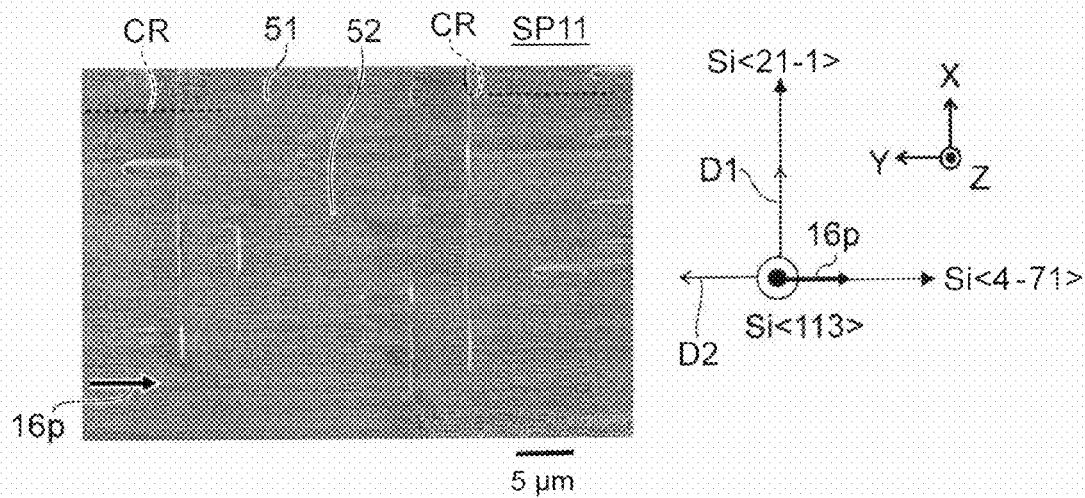
FIG. 5A and FIG. 5B are electron microscope photographs showing experimental results relating to the nitride semiconductor device.
Figure 5B:
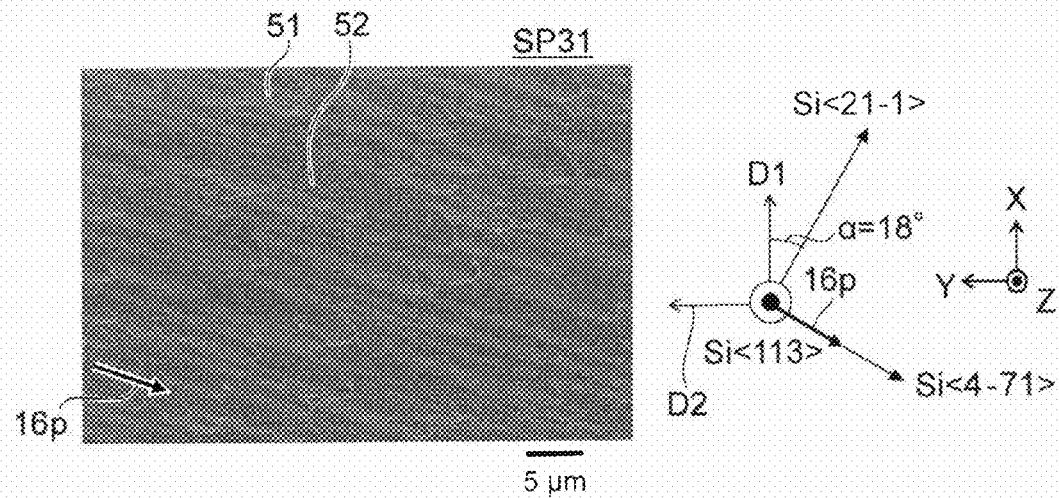

FIG. 5A and FIG. 5B are electron microscope photographs illustrating experimental results relating to the nitride semiconductor device.

FIG. 5A and FIG. 5B correspond to a fourth sample SP11 and a fifth sample SP31 recited below. In these samples, the width of the resist film 65 is about 2.5 μm. The width of the openings of the resist film 65 is about 2.5 μm. The period of the stripes is about 5 μm. In other words, in the fourth sample SP11 and the fifth sample SP31, the period of the stripes of the resist film 65 is shorter than that of the first to third samples SP10 to SP30.

In the fourth sample SP11, the extension direction of the stripes of the resist film 65 is parallel to the <21-1> direction of the silicon (the tilt angle is 0 degrees). In the fifth sample SP31, the extension direction of the stripes of the resist film 65 is tilted 18 degrees toward the <110> direction from the <21-1> direction of the silicon (the tilt angle is 18 degrees).

In the fourth sample SP11 and the fifth sample SP31, the growth time of the GaN layer 51 is 60 minutes which is longer than that of the first to third samples SP10 to SP30.

By setting the growth time to 60 minutes in the fourth sample SP11 as shown in FIG. 5A, the mutually adjacent GaN crystals that have the stripe configurations meet; and the GaN layer 51 (the foundation layer 50) is obtained. After the meeting, the thickness of the GaN layer 51 that is grown is about 2.5 µm. The major surface (the front surface) of the GaN layer 51 is the (11-22) plane. Cracks CR occur when the GaN layer 51 is returned to room temperature after the growth. The extension direction of the cracks CR is perpendicular to the extension direction (the first direction D1) of the recesses 45. The cracks CR extend along the second direction D2. The cracks CR extend in a direction perpendicular to the boundary where the multiple GaN crystals unite. Cracks that are aligned with the first direction D1 are not observed. The spacing (the spacing in the first direction D1) between the multiple cracks CR is about 500 µm.

By setting the growth time to 60 minutes in the fifth sample SP31 as shown in FIG. 5B as well, the mutually adjacent GaN crystals that have the stripe configurations meet; and the GaN layer 51 (the foundation layer 50) is obtained. The major surface (the front surface) of the GaN layer 51 is the (11-22) plane. The cracks CR are not observed even when the GaN layer 51 is returned to room temperature after the growth.

Thus, the cracks CR can be suppressed by setting the extension direction (the first direction D1) of the recesses 45 to be tilted a prescribed angle from the crystal orientation of the substrate 40. In the example, the extension direction of the recesses 45 is tilted from the <2-11> direction of the substrate 40. The orientation of the c-axis of the GaN layer 51 can be rotated in a plane (in the X-Y plane) parallel to the upper surface 40u (the major surface 40a) of the substrate 40. The cracks CR can be suppressed by rotating the orientation of the c-axis from a direction (the second direction D2) perpendicular to the extension direction of the recesses 45.

FIG. 6A to FIG. 6D are graphs of characteristics of the nitride semiconductor device.

Figure 6A:
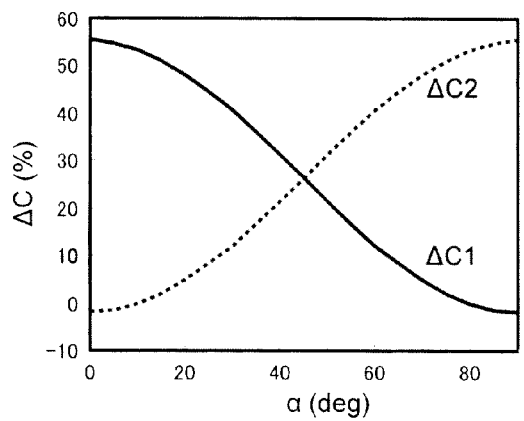
FIG. 6A to FIG. 6D are graphs of characteristics of the nitride semiconductor device.

FIG. 6A illustrates the difference between the coefficients of thermal expansion of the silicon substrate and the GaN layer when the extension direction (the first direction D1) of the recesses 45 of the substrate 40 is changed. The major surface of the silicon substrate is the (113) plane. The major surface of the GaN layer is the (11-22) plane. The horizontal axis is the angle (a tilt angle α) between the first direction D1 and the <21-1> direction of the silicon. The vertical axis is a coefficient of thermal expansion difference ΔC. The coefficient of thermal expansion difference ΔC is different between the two directions parallel to the upper surface 40u (the major surface 40a) of the substrate 40. A difference ΔC1 is the difference between the coefficients of thermal expansion in the extension direction (the first direction D1) of the recesses 45. A difference ΔC2 is the difference between the coefficients of thermal expansion in a direction (the second direction D2) perpendicular to the extension direction of the recesses 45. The tilt angle α corresponds to the angle between the direction 16p and the second direction D2.

Figure 6B:
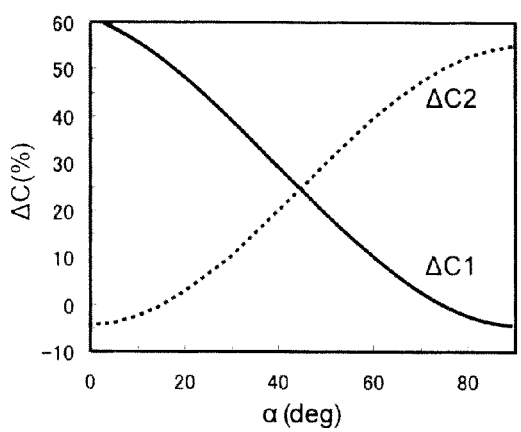

FIG. 6B illustrates the difference between the coefficients of thermal expansion of the silicon substrate and the GaN layer when the extension direction (the first direction D1) of the recesses 45 of the substrate 40 is changed. The major surface of the silicon substrate is the (001) plane. The major surface of the GaN layer is the (10-11) plane. In this case, the angle θ1 between the c-axis 16 and the major surface of the GaN layer is about 28 degrees. The horizontal axis is the angle (the tilt angle α) between the first direction D1 and the <-110> direction of the silicon. The vertical axis is the coefficient of thermal expansion difference ΔC.

Figure 6C:
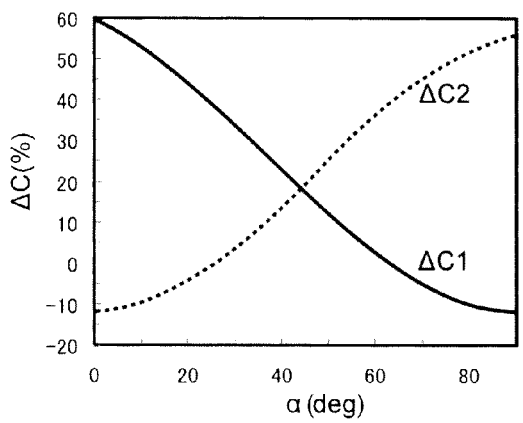

FIG. 6C illustrates the difference between the coefficients of thermal expansion of the silicon substrate and the GaN layer when the extension direction (the first direction D1) of the recesses 45 of the substrate 40 is changed. The major surface of the silicon substrate is the (110) plane. The major surface of the GaN layer is the (11-20) plane. In this case, the angle θ1 between the c-axis 16 and the major surface of the GaN layer is about 0 degrees. The horizontal axis is the angle (the tilt angle α) between the first direction D1 and the <-112> direction of the silicon. The vertical axis is the coefficient of thermal expansion difference ΔC.

Figure 6D:
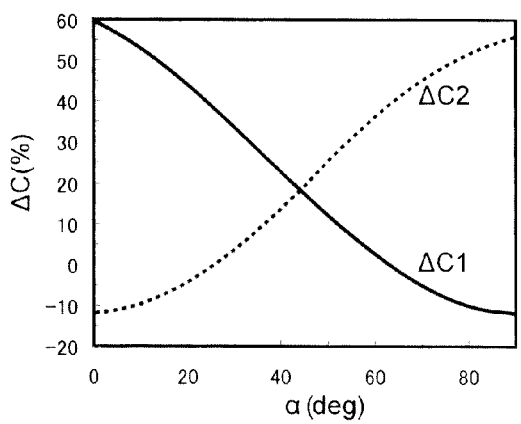

FIG. 6D illustrates the difference between the coefficients of thermal expansion of the silicon substrate and the GaN layer when the extension direction (the first direction D1) of the recesses 45 of the substrate 40 is changed. The major surface of the silicon substrate is the (112) plane. The major surface of the GaN layer is the (10-10) plane. In this case, the angle θ1 between the c-axis 16 and the major surface of the GaN layer is about 0 degrees. The horizontal axis is the angle (the tilt angle α) between the first direction D1 and the <-110> direction of the silicon. The vertical axis is the coefficient of thermal expansion difference ΔC.

The coefficient of thermal expansion of silicon is, for example, $3.59 \times 10^{-6}$ (/K). The coefficient of thermal expansion of GaN in the a-axis direction is, for example, $5.59 \times 10^{-6}$ (/K). The coefficient of thermal expansion of GaN in the c-axis direction is, for example, $3.17 \times 10^{-6}$ (/K). The size of the a-axis direction component and the c-axis direction component of GaN in the first direction D1 changes as the tilt angle α changes. In conjunction, the sizes of the a-axis direction component and the c-axis direction component of GaN in the second direction D2 change.

In FIG. 6A, the tilt angle α being 0 degrees corresponds to the extension direction (the first direction D1) of the recesses 45 being aligned with the <21-1> direction. In such a case, the difference ΔC1 of the coefficient of thermal expansion is large and is about 56%. Therefore, it is considered that the cracks CR aligned with the second direction D2 orthogonal to the first direction D1 occur.

When the tilt angle α is 0 degrees, the absolute value of the difference ΔC2 of the coefficients of thermal expansion is small and is about 2%. Therefore, it is considered that the cracks aligned with the first direction D1 do not occur easily.

The coefficient of thermal expansion of silicon is between the coefficient of thermal expansion of GaN in the a-axis direction and the coefficient of thermal expansion of GaN in the c-axis direction.

Therefore, by setting the c-axis to be tilted with respect to the stacking direction (the third direction D3), the coefficient of thermal expansion difference between silicon and the a-axis of GaN and the coefficient of thermal expansion difference between silicon and the c-axis of GaN have an effect of compensating each other. As a result, the sum total of the coefficient of thermal expansion difference becomes small. As a result, it is considered that the cracks do not occur easily in the direction perpendicular to the extension direction of the recesses 45.

As shown in FIG. 6A, the difference ΔC1 becomes small when the tilt angle α is large. This is because the component of the c-axis of GaN projected onto the first direction D1 becomes large. When the tilt angle α is 18 degrees, the difference ΔC1 is about 48%. In other words, the difference ΔC1 is about 10% smaller than when the tilt angle α is 0 degrees. Thereby, it is considered that the formation of the cracks is suppressed.

On the other hand, when the tilt angle α is 18 degrees, the difference ΔC2 increases and is about 4%. In other words, the anisotropy of the coefficient of thermal expansion difference (the difference between the difference ΔC1 and the difference ΔC2) decreases. Thereby, the anisotropy of the warp is suppressed.

Similarly, the difference ΔC1 decreases as the tilt angle α increases in FIG. 6B to FIG. 6D as well. On the other hand, the difference ΔC2 increases; and the anisotropy of the coefficient of thermal expansion difference (the difference between the difference ΔC1 and the difference ΔC2) decreases. By increasing the tilt angle α, the warp and the cracks CR aligned with the second direction D2 can be suppressed.

It is favorable for the tilt angle α to be not less than 5 degrees and not more than 85 degrees. When the tilt angle α is set to be less than 5 degrees or greater than 85 degrees, the change of the coefficient of thermal expansion difference (the difference ΔC1 and the difference ΔC2) from the value when the tilt angle α is 0 degrees is less than 1%. Therefore, the effects of suppressing the warp and the cracks are insufficient. It is more favorable for the tilt angle α to be 13 degrees or more. The anisotropy of the coefficient of thermal expansion difference is reduced; and the cracks are suppressed. It is more favorable for the tilt angle α to be 45 degrees or less. The c-axis orientation growth of the nitride crystal is easier; and the crystallinity is higher. The tilt angle α corresponds to the angle between the second direction D2 and the direction of the c-axis 16 projected onto the major surface of the GaN layer.

Thus, the anisotropy of the coefficient of thermal expansion difference can be suppressed by setting the direction of the c-axis 16 of the nitride semiconductor layer 15 projected onto the X-Y plane to be tilted with respect to the second direction D2. Thereby, the warp of the substrate 40 can be suppressed. The cracks CR can be suppressed.

In the embodiment, the c-axis 16 of the nitride semiconductor layer 15 is tilted with respect to the third direction D3 (i.e., the stacking direction). Thereby, the internal electric field occurring in the nitride semiconductor layer 15 can be suppressed; and the characteristics can be improved. For example, the luminous efficiency of a light emitting device using the nitride semiconductor layer 15 can be increased. The characteristics are improved; the warp is suppressed; the cracks are suppressed; and high productivity is obtained.

FIG. 7A to FIG. 7D are electron microscope photographs and a schematic view illustrating the nitride semiconductor device.

Figure 7A:
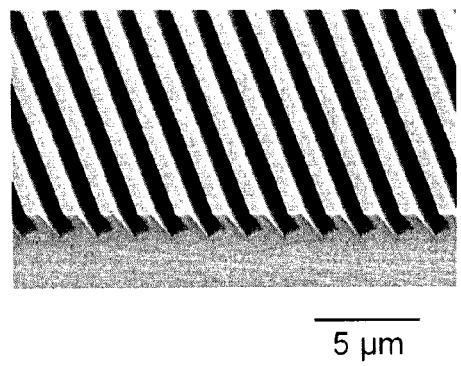
FIG. 7A to FIG. 7D are electron microscope photographs and a schematic view showing the nitride semiconductor device.
Figure 7D:
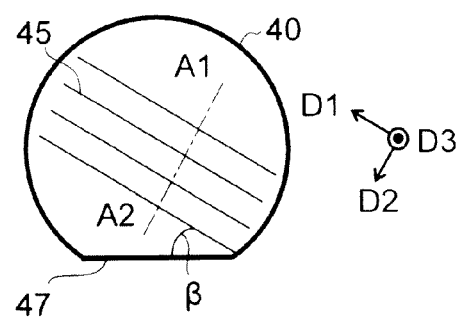
Figure 7B:
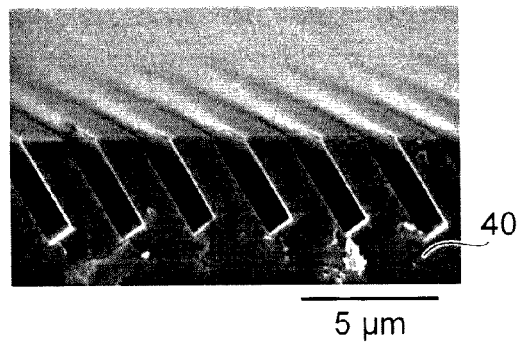
Figure 7C:
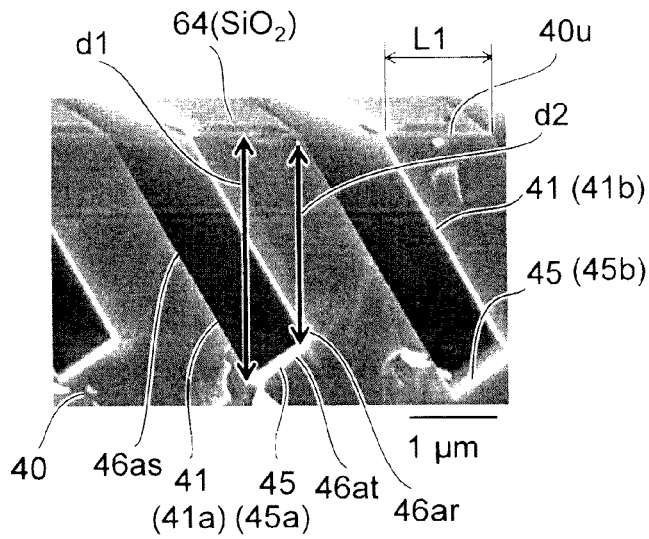

FIG. 7D is a schematic plan view illustrating the substrate 40 of the third sample SP30 recited above. FIG. 7A to FIG. 7C are electron microscope photographs of the line A1-A2 cross section of FIG. 7D.

As shown in FIG. 7D, the substrate 40 is silicon and has an orientation flat 47. An angle β between the orientation flat 47 and the extension direction (the first direction D1) of the recesses 45 is about 17 degrees.

The multiple recesses 45 are made as shown in FIG. 7A to FIG. 7C. The recesses 45 have trench configurations. A distance d1 between the upper surface 40u of the substrate 40 and the lower end of the side surface 46as is about 2.7 μm. A distance d2 between the upper surface 40u of the substrate 40 and the lower end of the side surface 46ar is about 2.2 μm. The silicon oxide film of the mask layer 64 is formed on the upper surface 40u of the substrate 40.

In the embodiment, it is favorable for the depth of each of the multiple recesses 45 provided in the substrate 40 to be not less than 0.3 μm and not more than 3 μm. It is more favorable to be not less than 0.5 μm and not more than 0.9 μm. The depth of the recesses 45 is the distance d1. Thereby, the growth from the bottom surface 46at is suppressed; the growth from the side surface 46as becomes dominant more easily; and the selectivity of the growth of the nitride crystal improves.

A length L1 in the second direction D2 of the upper surface 40u between each of the multiple recesses 45 (corresponding to the width of the resist film 65) is about 1 μm. The depth of each of the multiple recesses 45 (the distance d2) is not less than 0.3 times and not more than 3 times the length L1 in the second direction D2 of the upper surface 40u. Thereby, the growth of the GaN layer from the side surface 46as becomes dominant more easily; and the meltback etching is suppressed more easily. It is more favorable to be not less than 0.5 times and not more than 0.9 times the length L1. The crystallinity of the growth of the nitride crystal improves.

FIG. 8A to FIG. 8D are electron microscope photographs illustrating the nitride semiconductor device.

Figure 8A:
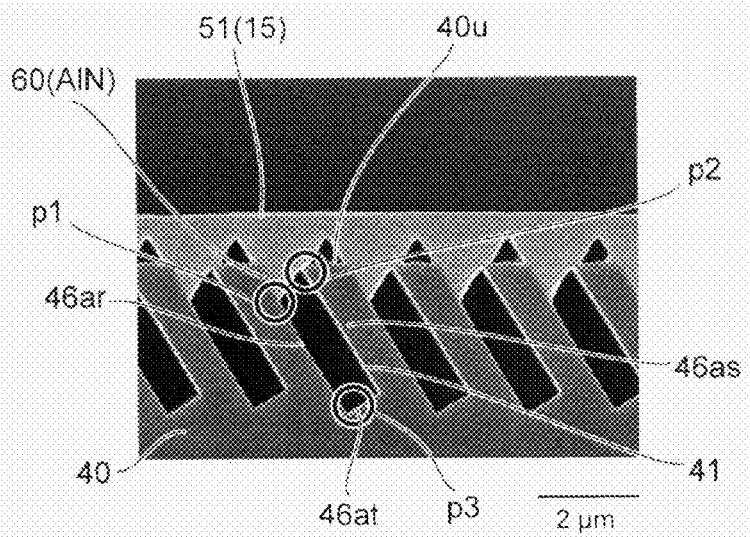
FIG. 8A to FIG. 8D are electron microscope photographs showing the nitride semiconductor device.
Figure 8B:
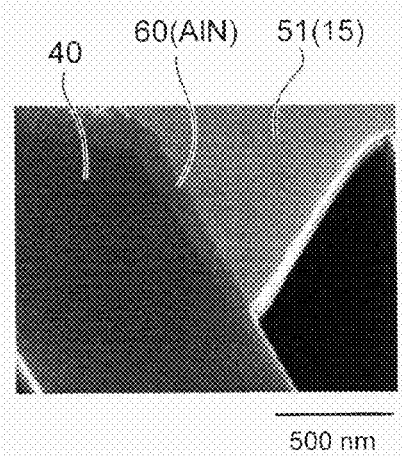
Figure 8C:
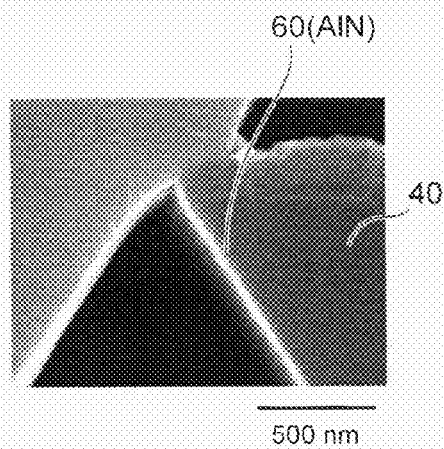
Figure 8D:
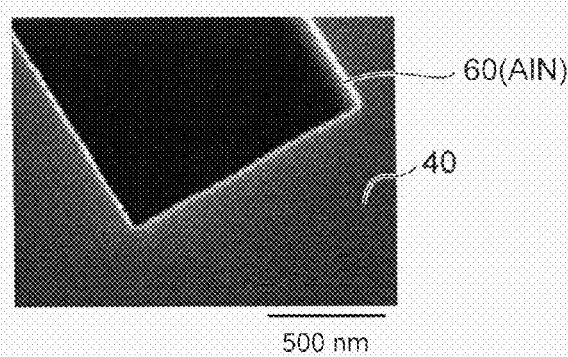

These figures are electron microscope photographs of a sample in which the nitride semiconductor layer 15 (the GaN layer 51) is grown using the substrate 40 of the third sample SP30. FIG. 8B to FIG. 8D are enlarged images of portion p1, portion p2, and portion p3 of FIG. 8A.

The buffer layer 60 (the AlN layer) grows on the front surfaces inside the recess 45 of the substrate 40. In the crystal growth of the nitride crystal, the source gas penetrates (by vapor phase diffusion) into the interior of the recess 45. Thereby, the AlN layer grows on the side surfaces 46as, the side surface 46ar, and the bottom surface 46at of the recess 45.

In the case where the depth of the recess 45 is too deep, the source gas does not penetrate (by vapor phase diffusion); and the AlN layer is not grown easily on the bottom surface 46at. In such a case, meltback etching occurs easily from the bottom surface 46at of the recess 45. Therefore, it is favorable for the depth of the recess 45 to be a depth at which the AlN layer grows. It is favorable for the depth of the recess 45 to be not less than 0.3 μm and not more than 3 μm.

Then, the GaN layer 51 is grown on the AlN layer. In FIG. 8A, the coverage of the AlN layer is good; and the silicon is covered with the AlN layer. Meltback etching does not occur between the GaN layer 51 and the substrate 40 (the silicon). It is desirable for the AlN layer to be formed in contact with the substrate 40 of silicon. As shown in FIG. 8A, the distance d1 to the lower end of the side surface 46as is about 2.8 μm. The distance d2 between the upper surface 40u of the substrate 40 and the lower end of the side surface 46ar is about 2.3 μm. The depth (the distance d2) of each of the multiple recesses 45 is about 3 times the length L1 in the second direction D2 of the upper surface 40u. The growth from the bottom surface 46at is suppressed; and the growth from the side surface 46as is dominant. In the case where the depth of the recess 45 is too shallow, growth from the bottom surface 46*at* occurs; the growth from the side surface 46*as* is obstructed; and the crystal quality degrades.

FIG. 9A to FIG. 9J are electron microscope photographs and schematic perspective views illustrating the nitride semiconductor device.

In the examples of FIG. 9A, FIG. 9C, FIG. 9E, FIG. 9G, and FIG. 9I, the dotted line in the figures shows the side surface 46*as*. In these examples, the side surface 46*as* substantially corresponds to the (111) plane of the silicon.

Figure 9A:
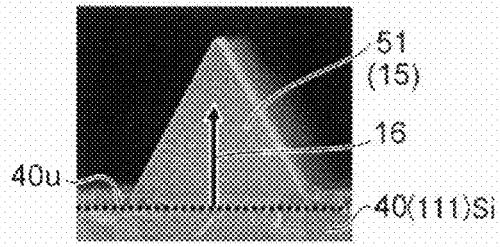
FIG. 9A to FIG. 9J are electron microscope photographs and schematic perspective views showing the nitride semiconductor device.
Figure 9B:
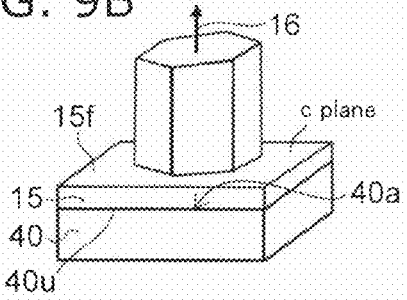

In the examples of FIG. 9A and FIG. 9B, the upper surface 40*u* of the substrate 40 is the (111) plane of the silicon. In such a case, the c-axis 16 of the nitride semiconductor layer 15 (e.g., the GaN layer 51) is substantially perpendicular to the upper surface 40*u* of the substrate 40. The c-plane of the nitride semiconductor layer 15 is substantially parallel to the upper surface 40*u*.

Figure 9C:
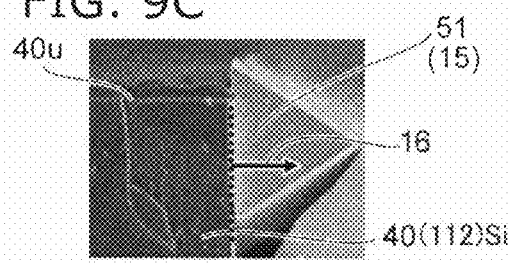
Figure 9D:
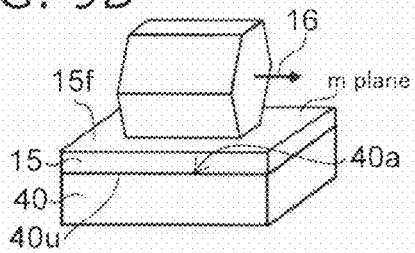

In the examples of FIG. 9C and FIG. 9D, the upper surface 40*u* of the substrate 40 is the (112) plane of the silicon. In such a case, the c-axis 16 of the nitride semiconductor layer 15 (e.g., the GaN layer 51) is parallel to the upper surface 40*u* of the substrate 40. The m-plane (the (10-10) plane) of the nitride semiconductor layer 15 is substantially parallel to the upper surface 40*u*.

Figure 9E:
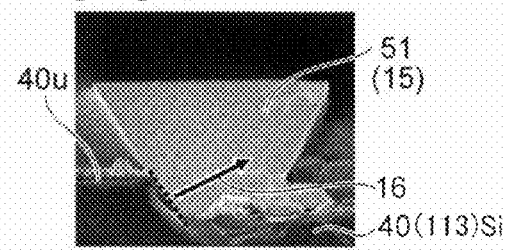
Figure 9F:
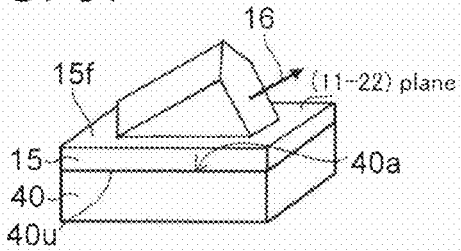

In the examples of FIG. 9E and FIG. 9F, the upper surface 40*u* of the substrate 40 is the (113) plane of the silicon. In such a case, the c-axis 16 of the nitride semiconductor layer 15 (e.g., the GaN layer 51) is tilted with respect to the upper surface 40*u* of the substrate 40. The (11-22) plane of the nitride semiconductor layer 15 is substantially parallel to the upper surface 40*u*.

Figure 9G:
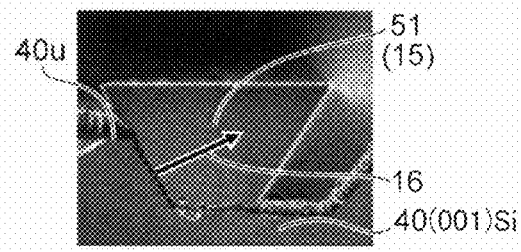
Figure 9H:
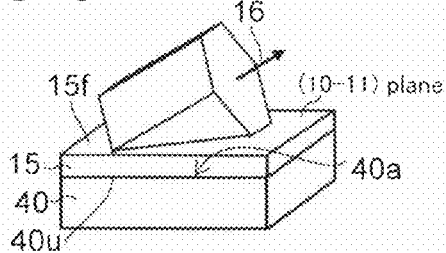

In the examples of FIG. 9G and FIG. 9H, the upper surface 40*u* of the substrate 40 is the (001) plane of the silicon. In such a case, the c-axis 16 of the nitride semiconductor layer 15 (e.g., the GaN layer 51) is tilted with respect to the upper surface 40*u* of the substrate 40. The (10-11) plane of the nitride semiconductor layer 15 is substantially parallel to the upper surface 40*u*.

Figure 9I:
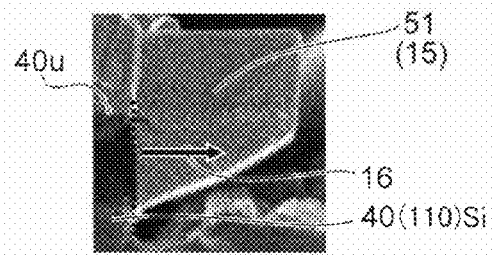
Figure 9J:
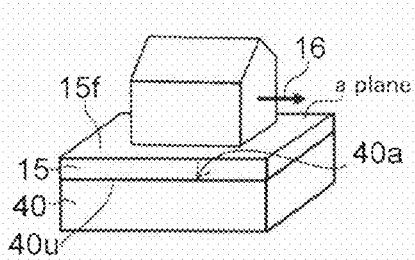

In the examples of FIG. 9I and FIG. 9J, the upper surface 40*u* of the substrate 40 is the (110) plane of the silicon. In such a case, the c-axis 16 of the nitride semiconductor layer 15 (e.g., the GaN layer 51) is substantially parallel to the upper surface 40*u* of the substrate 40. The a-plane (the (11-20) plane) of the nitride semiconductor layer 15 is substantially parallel to the upper surface 40*u*.

Thus, the plane orientation of the upper surface (the first surface 15*f*) and the direction of the c-axis 16 of the nitride semiconductor layer 15 can be controlled by changing the plane orientation of the silicon substrate used as the substrate 40.

As described above, for example, in the case where a (113) plane silicon substrate is used, the (11-22) plane of the nitride semiconductor layer 15 is parallel to the upper surface 40*u* of the substrate 40. In such a case, the angle between the c-axis 16 of the nitride semiconductor layer 15 and the axis perpendicular to the upper surface 40*u* of the substrate 40 is about 58 degrees. In other words, the angle θ1 between the c-axis 16 and the first surface 15*f* is about 32 degrees.

For example, a silicon substrate of the (001) plane tilted about 8 degrees toward the <110> direction may be used as the substrate 40. For example, an angle between the major surface 40*a* (the upper surface 40*u*) of the substrate 40 and the (001) plane is about 8 degrees. In such a case, the (10-11) plane of the nitride semiconductor layer 15 is parallel to the upper surface 40*u* of the substrate 40. In such a case, the angle between the c-axis 16 of the nitride semiconductor layer 15 and the axis perpendicular to the upper surface 40*u* of the substrate 40 is about 62 degrees. The angle θ1 between the c-axis 16 and the first surface 15*f* is about 28 degrees.

For example, a (112) plane silicon substrate may be used as the substrate 40. In such a case, the (10-10) plane of the nitride semiconductor layer 15 is parallel to the upper surface 40*u* of the substrate 40. In such a case, the angle between the c-axis 16 of the nitride semiconductor layer 15 and the upper surface 40*u* of the substrate 40 is substantially 0 degrees. The angle θ1 between the c-axis 16 and the first surface 15*f* is substantially 0 degrees.

For example, a (110) plane silicon substrate may be used as the substrate 40. In such a case, the (11-20) plane of the nitride semiconductor layer 15 is parallel to the upper surface 40*u* of the substrate 40. In such a case, the angle between the c-axis 16 of the nitride semiconductor layer 15 and the upper surface 40*u* of the substrate 40 is substantially 0 degrees. The angle θ1 between the c-axis 16 and the first surface 15*f* is substantially 0 degrees.

In the embodiment, a sapphire substrate may be used as the substrate 40.

For example, an r-plane ((1-102) plane) sapphire substrate may be used as the substrate 40. In such a case, the (11-22) plane of the nitride semiconductor layer 15 is parallel to the upper surface 40*u* of the substrate 40. In such a case, the angle between the axis perpendicular to the upper surface 40*u* of the substrate 40 and the c-axis 16 of the nitride semiconductor layer 15 is about 58 degrees. The angle θ1 between the c-axis 16 and the first surface 15*f* is about 32 degrees.

For example, an n-plane ((11-23) plane) sapphire substrate may be used as the substrate 40. In such a case, the (10-11) plane of the nitride semiconductor layer 15 is parallel to the upper surface 40*u* of the substrate 40. In such a case, the angle between the axis perpendicular to the upper surface 40*u* of the substrate 40 and the c-axis 16 of the nitride semiconductor layer 15 is about 62 degrees. The angle θ1 between the c-axis 16 and the first surface 15*f* is about 28 degrees.

For example, an a-plane ((11-20) plane)) sapphire substrate may be used as the substrate 40. In such a case, the (10-10) plane of the nitride semiconductor layer 15 is parallel to the upper surface 40*u* of the substrate 40. In such a case, the angle between the c-axis 16 of the nitride semiconductor layer 15 and the upper surface 40*u* of the substrate 40 is substantially 0 degrees. The angle θ1 between the c-axis 16 and the first surface 15*f* is substantially 0 degrees.

For example, an m-plane ((10-10) plane) or c-plane ((0001) plane) sapphire substrate may be used as the substrate 40. In such a case, the (11-20) plane of the nitride semiconductor layer 15 is parallel to the upper surface 40*u* of the substrate 40. In such a case, the angle between the c-axis 16 of the nitride semiconductor layer 15 and the upper surface 40*u* of the substrate 40 is substantially 0 degrees. The angle θ1 between the c-axis 16 and the first surface 15*f* is substantially 0 degrees.

For example, a c-plane ((0001) plane) sapphire substrate may be used as the substrate 40. In such a case, the (11-20) plane of the nitride semiconductor layer 15 is parallel to the upper surface 40*u* of the substrate 40. In such a case, the angle between the c-axis 16 of the nitride semiconductor layer 15 and the upper surface 40*u* of the substrate 40 is substantially 0 degrees. The angle θ1 between the c-axis 16 and the first surface 15*f* is substantially 0 degrees.

The crystal plane of the first surface 15f (the major surface) of the nitride semiconductor layer 15 can be changed according to the plane orientation of the substrate 40.

For example, in the embodiment, the first surface 15f of the nitride semiconductor layer 15 is parallel to one of the (11-22) plane, the (10-11) plane, the (11-20) plane, or the (10-10) plane. In the case where an unevenness, etc., is formed in the front surface of the nitride semiconductor layer 15, the first surface 15f may include a portion parallel to one of the (11-22) plane, the (10-11) plane, the (11-20) plane, or the (10-10) plane.

FIG. 10A to FIG. 10D are schematic cross-sectional views illustrating nitride semiconductor devices according to the first embodiment.

In these examples, the nitride semiconductor device is a light emitting device (e.g., an LED).

Figure 10A:
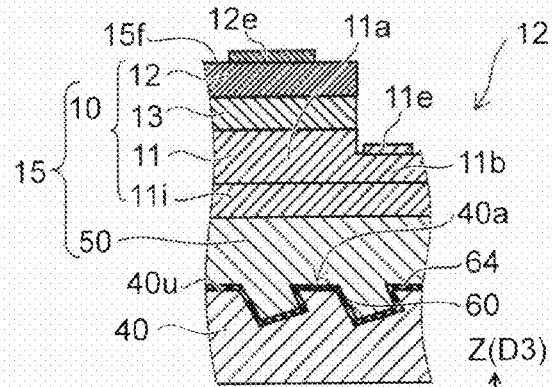
FIG. 10A to FIG. 10D are schematic cross-sectional views showing nitride semiconductor devices according to the first embodiment.

In a nitride semiconductor device 121 shown in FIG. 10A, the foundation layer 50 (e.g., a GaN layer) is provided on the substrate 40; and the functional layer 10 is provided on the foundation layer 50. The functional layer 10 further includes a low impurity concentration layer 11i in addition to the first semiconductor layer 11, the second semiconductor layer 12, and the active layer 13. The low impurity concentration layer 11i is disposed between the first semiconductor layer 11 and the foundation layer 50. The impurity concentration of the low impurity concentration layer 11i is lower than the impurity concentration of the first semiconductor layer 11. The low impurity concentration layer 11i includes, for example, undoped GaN.

In the example, the first semiconductor layer 11 includes a first portion 11a and a second portion 11b. The second portion 11b is arranged with the first portion 11a in a plane parallel to the first surface 15f. The second semiconductor layer 12 is separated from the first portion 11a in the third direction D3. The active layer 13 is disposed between the second semiconductor layer 12 and the first portion 11a.

A first electrode 11e and a second electrode 12e are provided. The first electrode 11e is electrically connected to the second portion 11b of the first semiconductor layer 11. The second electrode 12e is electrically connected to the second semiconductor layer 12.

By applying a voltage between the first electrode 11e and the second electrode 12e, a current is supplied to the active layer 13; and light is emitted from the active layer 13.

Figure 10B:
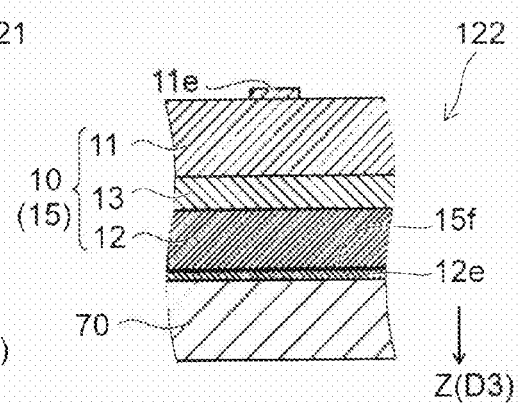

In a nitride semiconductor device 122 shown in FIG. 10B, the substrate 40 and the foundation layer 50 are removed after the nitride semiconductor layer 15 is formed. In the example, a supporter 70 is provided. The second electrode 12e is provided between the first electrode 11e and the supporter 70. The functional layer 10 is provided between the first electrode 11e and the second electrode 12e.

Figure 10C:
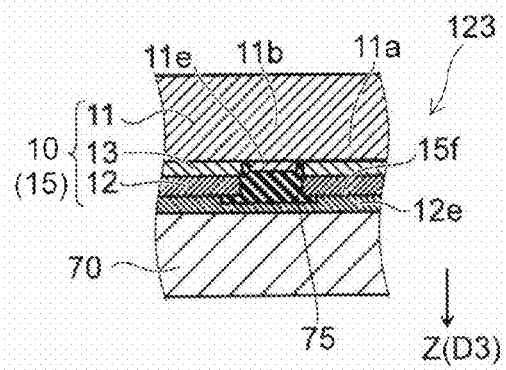

In a nitride semiconductor device 123 shown in FIG. 10C as well, the substrate 40 and the foundation layer 50 are removed. The second semiconductor layer 12 is disposed between the supporter 70 and the first portion 11a of the first semiconductor layer 11. The second electrode 12e is disposed between the second semiconductor layer 12 and the supporter 70. The supporter 70 is electrically connected to the second electrode 12e. The active layer 13 is disposed between the first portion 11a and the second semiconductor layer 12. The first electrode 11e is provided between the supporter 70 and the second portion 11b of the first semiconductor layer 11. An insulating layer 75 is provided between the first electrode 11e and the supporter 70. The first electrode 11e is electrically insulated from the active layer 13, the second semiconductor layer 12, the second electrode 12e, and the supporter 70.

Figure 10D:
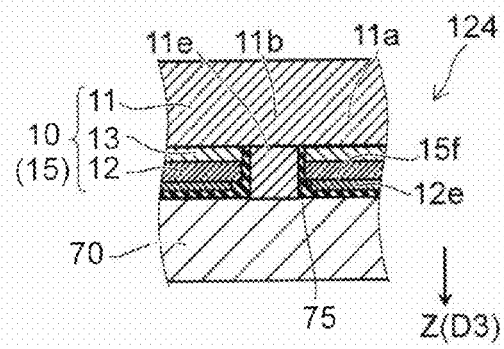

In a nitride semiconductor device 124 shown in FIG. 10D as well, the substrate 40 and the foundation layer 50 are removed. In the example, the supporter 70 is electrically connected to the first electrode 11e. The insulating layer 75 is provided between the second electrode 12e and the supporter 70. The first electrode 11e and the supporter 70 are electrically insulated from the active layer 13, the second semiconductor layer 12, and the second electrode 12e.

Figure 11:
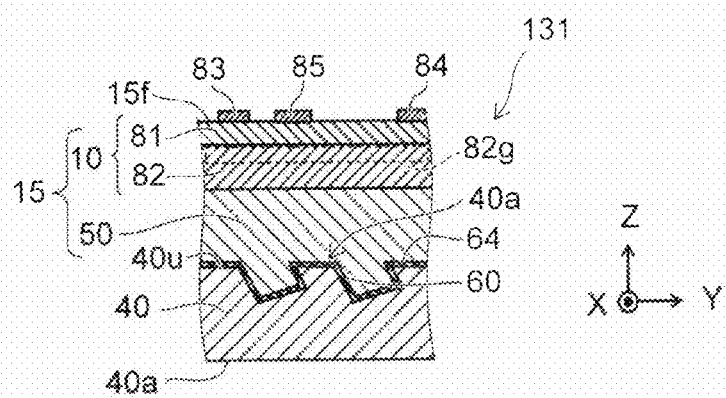
FIG. 11 is a schematic cross-sectional view showing another nitride semiconductor device according to the first embodiment.

FIG. 11 is a schematic cross-sectional view illustrating another nitride semiconductor device according to the first embodiment.

The nitride semiconductor device 131 of the example is a HEMT (High Electron Mobility Transistor) device. In the nitride semiconductor device 131, the functional layer 10 includes a first layer 81 and a second layer 82. A gate electrode 85, a source electrode 83, and a drain electrode 84 are provided in the nitride semiconductor device 131.

The second layer 82 is provided between the first layer 81 and the substrate 40.

The second layer 82 includes, for example, undoped $Al_\alpha Ga_{1-\alpha}N$ ($0 \leq \alpha \leq 1$). The first layer 81 includes, for example, undoped or n-type $Al_\beta Ga_{1-\beta}N$ ($0 \leq \beta \leq 1$ and $\alpha < \beta$). For example, the second layer 82 includes an undoped GaN layer; and the first layer 81 includes an undoped or n-type AlGaN layer.

The functional layer 10 is disposed between the substrate 40 and the gate electrode 85, between the substrate 40 and the source electrode 83, and between the substrate 40 and the drain electrode 84. These electrodes are arranged in the X-Y plane. The gate electrode 85 is disposed between the source electrode 83 and the drain electrode 84. The source electrode 83 and the drain electrode 84 have ohmic contacts with the first layer 81. For example, the gate electrode 85 has a Schottky contact with the first layer 81.

The lattice constant of the first layer 81 is smaller than the lattice constant of the second layer 82. Thereby, strain occurs in the first layer 81. Piezoelectric polarization occurs inside the first layer 81 due to the piezoelectric effect. A two-dimensional electron gas 82g is formed in the vicinity of the interface between the second layer 82 and the first layer 81.

By controlling the voltage applied to the gate electrode 85 in the nitride semiconductor device 131, the concentration of the two-dimensional electron gas 82g under the gate electrode 85 changes; and the current that flows between the source electrode 83 and the drain electrode 84 is controlled.

Thus, in addition to the substrate 40 and the nitride semiconductor layer 15, the nitride semiconductor device 131 of the example further includes a first electrode (the source electrode 83), a second electrode (the drain electrode 84), and a third electrode (the gate electrode 85). The nitride semiconductor layer 15 is disposed between the substrate 40 and these electrodes. The nitride semiconductor layer 15 (e.g., the functional layer 10) includes the first layer 81 and the second layer 82. The second layer 82 is disposed between the first layer 81 and the substrate 40. The lattice constant of the first layer 81 is smaller than the lattice constant of the second layer 82.

By using the nitride semiconductor layer 15 according to the embodiment in the nitride semiconductor device 131, the warp is suppressed; and the cracks CR can be suppressed.

Thus, the nitride semiconductor device according to the embodiment includes the nitride semiconductor layer 15. The nitride semiconductor layer 15 is formed on the substrate 40. The substrate 40 spreads along the major surface

40a. The major surface 40a includes the upper surface 40u and the multiple oblique surfaces 41 (referring to FIG. 1B). The multiple oblique surfaces 41 are tilted with respect to the upper surface 40u. Each length of the multiple oblique surfaces 41 in the first direction D1 parallel to the upper surface 40u is longer than each length of the multiple oblique surfaces 41 in the second direction D2 parallel to the upper surface 40u and perpendicular to the first direction D1. The multiple oblique surfaces 41 are arranged in the second direction. The nitride semiconductor layer 15 is grown from such multiple oblique surfaces 41 of the substrate 40. The c-axis 16 of the nitride semiconductor layer 15 is tilted with respect to the second direction D2. The c-axis 16 intersects the third direction D3 perpendicular to the upper surface 40u. For example, the c-axis 16 is tilted with respect to the third direction D3.

The angle between the c-axis 16 and the upper surface 40u is not less than 0 degrees and not more than 85 degrees. The angle between the second direction D2 and the direction of the c-axis 16 projected onto the upper surface 40u is not less than 5 degrees and not more than 85 degrees.

For example, in the case where the substrate 40 is a silicon substrate, the upper surface 40u of the substrate 40 is parallel to one of the (113) plane, the (001) plane, the (112), or the (110) plane of silicon.

The plane orientation of the substrate 40 is not strictly limited to a plane; and an equivalent plane in which the indices are interchanged may be used. For example, in the case of the (113) plane of silicon, the (11-3) plane, the (311) plane, etc., may be used. In other words, it is sufficient to use a crystal plane expressed as the {113} plane as an inclusive expression using Miller indexes that includes planes equivalent to the (113) plane.

Figure 12:
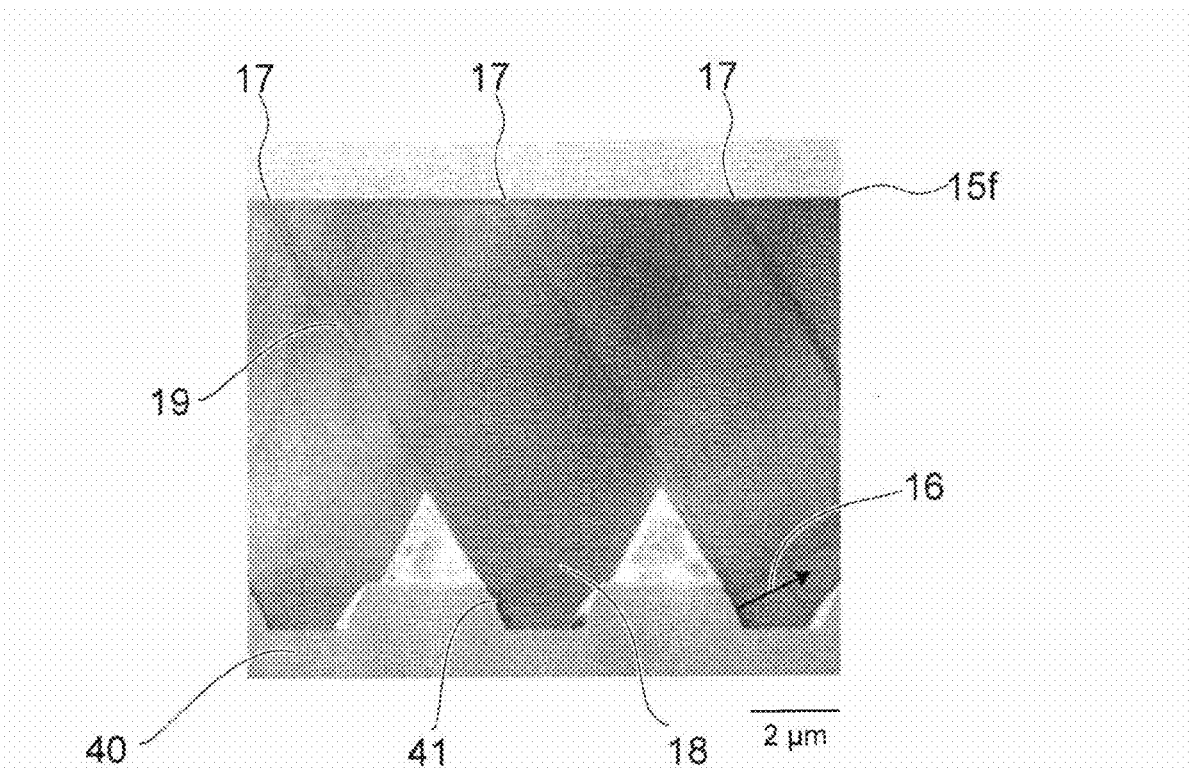
FIG. 12 is an electron microscope photograph showing the nitride semiconductor device.

FIG. 12 is an electron microscope photograph illustrating the nitride semiconductor device.

FIG. 12 shows the c-axis 16 measured using electron diffraction, etc. FIG. 12 is a cross section TEM image observing from the first direction D1.

A dislocation 18 is observed in FIG. 12. The c-axis 16 and the direction of the dislocation 18 are substantially parallel. The direction of the dislocation 18 is the c-axis 16. The dislocation 18 that is illustrated extends from a starting point at the oblique surface 41. As long as an operation is not performed on the direction of the dislocation 18, the direction of the dislocation 18 will not change inside the nitride crystal. Even in the case where the oblique surface is not observed, the direction of the dislocation 18 is the c-axis 16.

As shown in FIG. 12, a stacking fault 19 is observed. The stacking fault 19 extends along a direction perpendicular to the c-axis. Accordingly, the stacking fault 19 intersects the major surface (the first surface 15f) of the nitride crystal. The stacking fault 19 is formed mainly in the region of the boundary 17. For example, the c-axis 16 and the boundary 17 can be determined from the direction of the stacking fault 19, the direction of the dislocation 18, etc., in the case where the oblique surface is not observed. For example, because the stacking fault 19 intersects the major surface, it can be determined that the c-axis 16 intersects the third direction D3 perpendicular to the upper surface 40u.

Second Embodiment

The embodiment relates to a method for manufacturing the nitride semiconductor layer.

Figure 13:
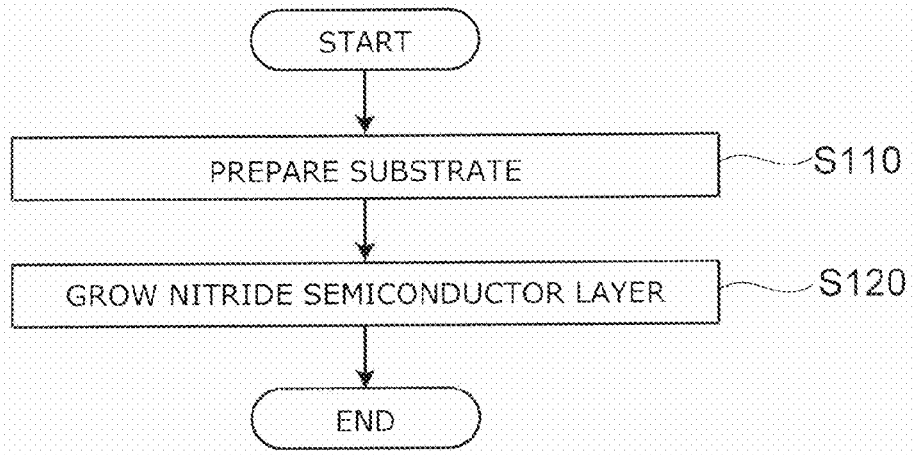
FIG. 13 is a flowchart showing a method for manufacturing a nitride semiconductor layer according to a second embodiment.

FIG. 13 is a flowchart illustrating the method for manufacturing the nitride semiconductor layer according to the second embodiment.

In the manufacturing method, the substrate 40 is prepared (step S110). The substrate 40 has the major surface 40a. The major surface 40a includes the upper surface 40u and the multiple oblique surfaces 41. The multiple oblique surfaces 41 are tilted with respect to the upper surface 40u. Each length of the multiple oblique surfaces 41 in the first direction D1 parallel to the upper surface 40u is longer than each length of the multiple oblique surfaces 41 in the second direction D2 parallel to the upper surface 40u and perpendicular to the first direction D1. The multiple oblique surfaces 41 are arranged in the second direction D2.

In the manufacturing method, the nitride semiconductor layer 15 is grown by epitaxial growth from the multiple oblique surfaces 41 (step S120).

The c-axis 16 of the nitride semiconductor layer 15 is tilted with respect to the first direction D1. The c-axis 16 is tilted with respect to the second direction D2. The c-axis 16 intersects the third direction D3 perpendicular to the upper surface 40u. For example, the c-axis 16 is tilted with respect to the third direction D3.

According to the manufacturing method, the warp can be suppressed; and the cracks CR can be suppressed.

In the nitride semiconductor layer, the nitride semiconductor device, and the method for manufacturing the nitride semiconductor layer according to the embodiments, the method for depositing the nitride semiconductor layer 15 may include, for example, metal-organic chemical vapor deposition (MOCVD), metal-organic vapor phase epitaxy (MOVPE), molecular beam epitaxy (MBE), hydride vapor phase epitaxy (HVPE), etc.

According to the embodiments, a nitride semiconductor layer, a nitride semiconductor device, and a method for manufacturing the nitride semiconductor layer having high productivity can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the nitride semiconductor device such as the nitride semiconductor layer, the substrate, the buffer layer, the foundation layer, the semiconductor layer, the active layer, the electrode, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all nitride semiconductor layers, nitride semiconductor devices, and methods for manufacturing nitride semiconductor layers practicable by an appropriate design modification by one skilled in the art based on the nitride semiconductor layers, the nitride semiconductor devices, and the methods for manufacturing nitride semiconductor layers described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor layer spreading along a first surface, the nitride semiconductor layer comprising:
    a first region, wherein a length of the first region in a first direction parallel to the first surface is longer than a length of the first region in a second direction parallel to the first surface, wherein the second direction is perpendicular to the first direction; and
    a second region arranged with the first region in the second direction, wherein a length of the second region in the first direction is longer than a length of the second region in the second direction,
    wherein the nitride semiconductor has a c-axis that is tilted with respect to the second direction for the first region and the second region,
    wherein the c-axis intersects a third direction, wherein the third direction is perpendicular to the first direction and the second direction, and
    wherein the c-axis is tilted with a plane including the second direction and the third direction.

2. The layer according to claim 1, wherein an angle between the c-axis and the first surface is not more than 85 degrees.

3. The layer according to claim 1, wherein an angle between the second direction and a direction of the c-axis projected onto the first surface is not less than 5 degrees and not more than 85 degrees.

4. The layer according to claim 1, wherein the first surface is parallel to one of a (11-22) plane, a (10-11) plane, a (11-20) plane, or a (10-10) plane.

5. The layer according to claim 1, further comprising:
    a first semiconductor layer of a first conductivity type;
    a second semiconductor layer of a second conductivity type separated from the first semiconductor layer in the third direction; and
    an active layer provided between the first semiconductor layer and the second semiconductor layer.

6. A nitride semiconductor device, comprising:
    a substrate including a major surface having an upper surface and a plurality of oblique surfaces, the oblique surfaces being tilted with respect to the upper surface, wherein each length of the oblique surfaces in a first direction parallel to the upper surface is longer than each length of the oblique surfaces in a second direction parallel to the upper surface, wherein the second direction is perpendicular to the first direction, and the oblique surfaces are arranged in the second direction; and
    a nitride semiconductor layer grown from the oblique surfaces,
    wherein the nitride semiconductor has a c-axis that is tilted with respect to the second direction,
    wherein the c-axis intersects a third direction, wherein the third direction is perpendicular to the first direction and the second direction, and
    wherein the c-axis is tilted with a plane including the second direction and the third direction.

7. The device according to claim 6, wherein at least a portion of the substrate is removed.

8. The device according to claim 6, wherein an angle between the c-axis and the upper surface is not more than 85 degrees.

9. The device according to claim 6, wherein an angle between the second direction and a direction of the c-axis projected onto the upper surface is not less than 5 degrees and not more than 85 degrees.

10. The device according to claim 6, wherein one of a (11-22) plane, a (10-11) plane, a (11-20) plane, or a (10-10) plane of the nitride semiconductor layer is parallel to the upper surface.

11. The device according to claim 6, wherein the substrate is a silicon substrate.

12. The device according to claim 11, wherein the upper surface is parallel to one of a (113) plane, a (001) plane, a (112), or a (110) plane of silicon.

13. The device according to claim 6, wherein the substrate has a plurality of recesses arranged in the second direction, and wherein the oblique surfaces respectively is portions of side surfaces of the recesses.

14. The device according to claim 6, wherein the substrate has a plurality of recesses arranged in the second direction,
    wherein each of the recesses has a first side surface and a second side surface, wherein the first side surface and the second side surface face each other, and
    wherein the oblique surfaces respectively is the first side surfaces of the recesses.

15. The device according to claim 6, wherein a depth of each of the recesses is not less than 0.3 micrometers and not more than 3 micrometers.

16. The device according to claim 6, wherein a depth of each of the recesses is not less than 0.3 times and not more than 3 times a length in the second direction of the upper surface in each space between the recesses.

17. The nitride semiconductor device according to claim 6, wherein the nitride semiconductor layer includes:
    a first semiconductor layer; and
    a foundation layer provided between the first semiconductor layer and the substrate,
    wherein an impurity concentration of the first semiconductor layer is higher than an impurity concentration of the foundation layer.

18. The device according to claim 6, further comprising:
    a first electrode;
    a second electrode;
    a third electrode arranged in a plane parallel to the upper surface; and
    a functional layer,
    wherein the nitride semiconductor layer is disposed between the substrate and the first electrode, between the substrate and the second electrode, and between the substrate and the third electrode,
    wherein the functional layer includes a first layer and a second layer,
    wherein the second layer is disposed between the first layer and the substrate, and wherein a lattice constant of the first layer is smaller than a lattice constant of the second layer.

19. A nitride semiconductor device, comprising:
a nitride semiconductor layer,
a substrate including a major surface having an upper surface and a plurality of oblique surfaces, wherein the oblique surfaces are tilted with respect to the upper surface, each length of the oblique surfaces in a first direction parallel to the upper surface is longer than each length of the oblique surfaces in a second direction parallel to the upper surface, wherein the second direction is perpendicular to the first direction, wherein the oblique surfaces are arranged in the second direction, and wherein the nitride semiconductor layer is grown from the oblique surfaces of the substrate,
wherein the nitride semiconductor layer has a c-axis that is tilted with respect to the second direction,
wherein the c-axis intersects a third direction, wherein the third direction is perpendicular to the first direction and the second direction,
wherein the c-axis is tilted with a plane including the second direction and the third direction.

20. A method for manufacturing a nitride semiconductor layer, comprising:
preparing a substrate including a major surface having an upper surface and a plurality of oblique surfaces, wherein the oblique surfaces are tilted with respect to the upper surface, wherein each length of the oblique surfaces in a first direction parallel to the upper surface is longer than each length of the oblique surfaces in a second direction parallel to the upper surface, wherein the second direction is perpendicular to the first direction, and wherein the oblique surfaces are arranged in the second direction; and
growing the nitride semiconductor layer from the oblique surfaces,
wherein the nitride semiconductor layer has a c-axis that is tilted with respect to the second direction,
wherein the c-axis intersects a third direction, wherein the third direction is perpendicular to the first direction and the second direction, and
wherein the c-axis is tilted with a plane inducing the second direction and the third direction.

* * * * *